United States Patent
Ching et al.

(10) Patent No.: US 11,205,714 B2
(45) Date of Patent: Dec. 21, 2021

(54) DUMMY STRUCTURE AT FIN CUT

(71) Applicant: Taiwan Semiconductor Manufacturing Co., Ltd., Hsin-Chu (TW)

(72) Inventors: Kuo-Cheng Ching, Hsinchu County (TW); Shi Ning Ju, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/293,308

(22) Filed: Mar. 5, 2019

(65) Prior Publication Data

US 2020/0105903 A1   Apr. 2, 2020

Related U.S. Application Data

(60) Provisional application No. 62/738,156, filed on Sep. 28, 2018.

(51) Int. Cl.

| | |
|---|---|
| *H01L 29/66* | (2006.01) |
| *H01L 29/78* | (2006.01) |
| *H01L 27/11* | (2006.01) |
| *H01L 29/06* | (2006.01) |
| *H01L 29/161* | (2006.01) |

(52) U.S. Cl.
CPC ...... *H01L 29/6681* (2013.01); *H01L 27/1104* (2013.01); *H01L 29/0649* (2013.01); *H01L 29/161* (2013.01); *H01L 29/7851* (2013.01)

(58) Field of Classification Search
CPC ..... H01L 21/823431; H01L 21/823821; H01L 21/845; H01L 27/0826; H01L 27/0924; H01L 27/10826; H01L 27/10879; H01L 27/1211; H01L 29/41791; H01L 29/66785; H01L 29/7831; H01L 29/785; H01L 27/0886
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,190,496 B2 * | 11/2015 | Lin ................ H01L 29/401 |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2018/0006040 A1 * | 1/2018 | Huang ............ H01L 27/1116 |

* cited by examiner

*Primary Examiner* — Suberr L Chi
(74) *Attorney, Agent, or Firm* — Haynes and Boone, LLP

(57) ABSTRACT

In one example, a semiconductor device includes a substrate, a first elongated fin structure disposed on the substrate, and a second elongated fin structure disposed on the substrate. The longitudinal axis of the first elongated fin structure is aligned with a longitudinal axis of the second elongated fin structure. The device further includes a dummy structure extending between the first elongated fin structure and the second elongated fin structure. The dummy structure includes a dielectric material.

19 Claims, 27 Drawing Sheets

DUMMY STRUCTURE AT FIN CUT

PRIORITY INFORMATION

This application claims priority to U.S. Provisional Application No. 62/738,156 filed Sep. 28, 2018 and entitled "Dummy Structure at Fin Cut," the disclosure of which is hereby incorporated by reference in the entirety.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

One type of semiconductor device that can be fabricated is a Fin Field Effect Transistor (FinFET). In a FinFET, a fin-shaped semiconductor structure is formed on a substrate. A gate structure that wraps around the fin structure can then be formed. Additionally, active regions including source/drain regions are then formed within the fin structure adjacent the gate structure. A particular fin structure may be used for multiple transistors in a circuit. In some examples, it is desirable to separate one portion of the fin from another. Accordingly, a portion of a long fin may be removed, or "cut" to separate two sections of an elongated fin structure. It is desirable that circuits, such as Static Random Access Memory (SRAM) circuits, be designed such that the fin structures have sufficient electrical isolation, mechanical strength and reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
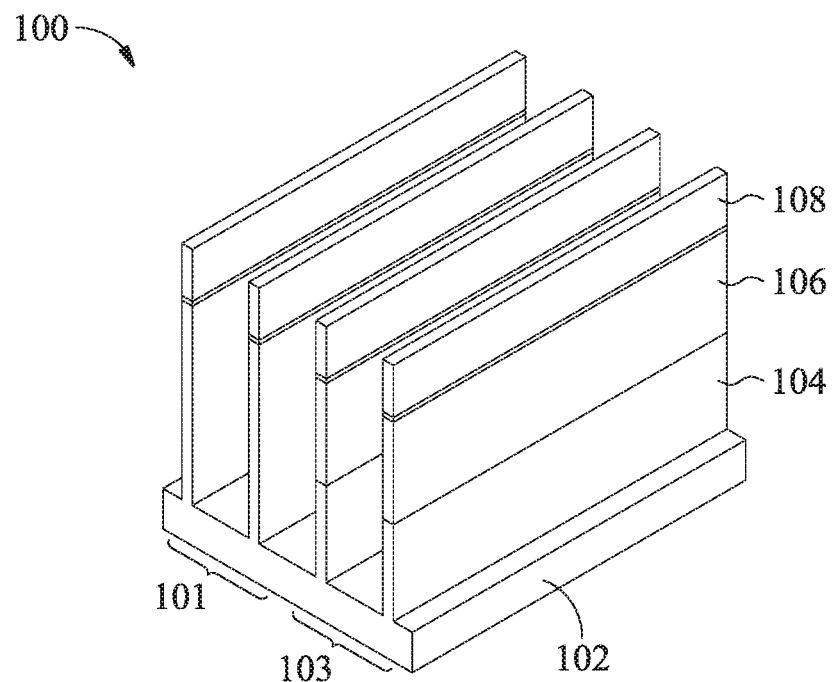
FIGS. 1A, 1B, 1C, 1D, 1E, 1F, 1G, 1H, 1I, 1J, 1K, 1L, 1M, 1N, 1O, 1P, 1Q, 1R, 1S, 1T, 1U, 1V, 1W, and 1X are diagrams showing cross-sectional and top views of a process for forming a dummy fin structure within a fin-cut region, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable that circuits, such as Static Random Access Memory (SRAM) circuits, be designed such that the fin structures have sufficient electrical isolation, mechanical strength and reliability.

According to principles described herein, dummy structures are formed within a fin-cut region. A fin-cut region is the space where portions of fin-structures have been removed after a fin-cut process. In one example, the dummy structure is a dummy fin structure extending between the fin structures on both ends. In one example, the dummy structure is a bulk dummy structure that also extends between adjacent dummy fins. In one example, the dummy structure includes gate extensions extending into the fin-cut region. By placing such dummy structures within the fin-cut region, additional mechanical stability is provided. Additionally, the dummy structures prevent STI loss and damage to the gate structures during subsequent processes.

Figure 1B:
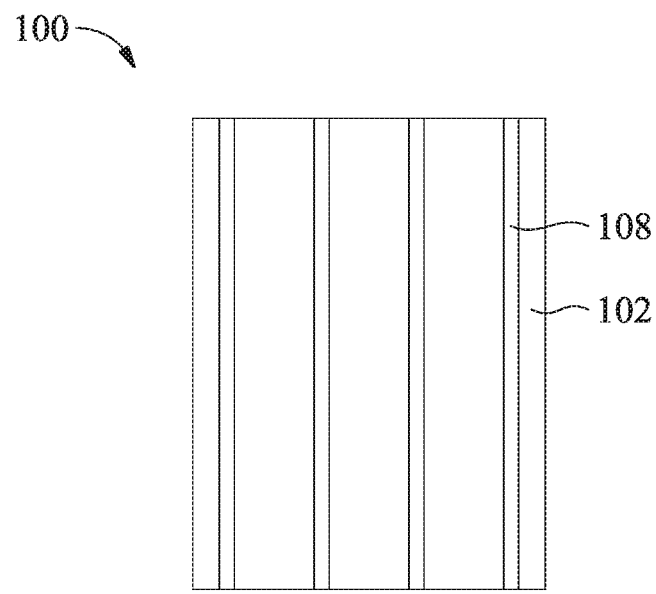

FIGS. 1A, 1B, 1C, 1D, 1E, 1F, 1G, 1H, 1I, 1J, 1K 1L, 1M, 1N, 1O, 1P, 1Q, 1R, 1S, 1T, 1U, 1V are diagrams showing cross-sectional and top views of a process for forming a dummy fin structure within a fin-cut region. FIG. 1A illustrates a workpiece 100 after a plurality of fin structures 101, 103 are formed on a substrate 102. The workpiece 100 may be part of a semiconductor wafer upon which various fabrication processes are applied to create various circuit components such as transistors, resistors, capacitors, etc. The circuit components may form various integrated circuit devices such as processors including various standard logic cells or memory chips such as a Static Random Access Memory (SRAM) memory chip. In some embodiments, the circuit components include an analog device, such as a ring oscillator. In Some examples, the circuit components may be part of n-type devices. FIG. 1B illustrates a top view of the fin structures 101, 103 that are formed on the substrate 102.

In the present example, a set of n-type metal oxide semiconductor (NMOS) fin structures 101 are formed and a set of p-type metal oxide semiconductor (PMOS) fin structures 103 are formed. The PMOS fin structures 103 include a lower portion 104 and an upper portion 106. In one example, the lower portion is made of the same type of semiconductor material as the substrate 102. For example, the lower portion may include silicon, germanium, silicon germanium, or other semiconductor materials. For example, if it is a silicon substrate, then the silicon lower portion 104 of the PMOS fin structures 103 includes silicon. The upper portion 106 of the fin structures 103 may include a different semiconductor material such as silicon germanium. Both types of fin structures 101, 103 include a hard mask layer 108 formed on top.

The fin structures 101, 103 may be formed in a variety of manners. In one example, the fin structures may be formed by using photolithographic techniques to pattern the semiconductor substrate 102 and perform an etching process that removes the portions between the fin structures 101, 103. The upper portions 106 may be formed by replacing an upper portion of the substrate before the etch back process. The replacement process may involve removing the upper portion of the substrate in the PMOS regions, and using an epitaxial growth process to replace the removed upper portion. Other methods of fabricating the fin structures 101, 103 are contemplated.

Figure 1C:
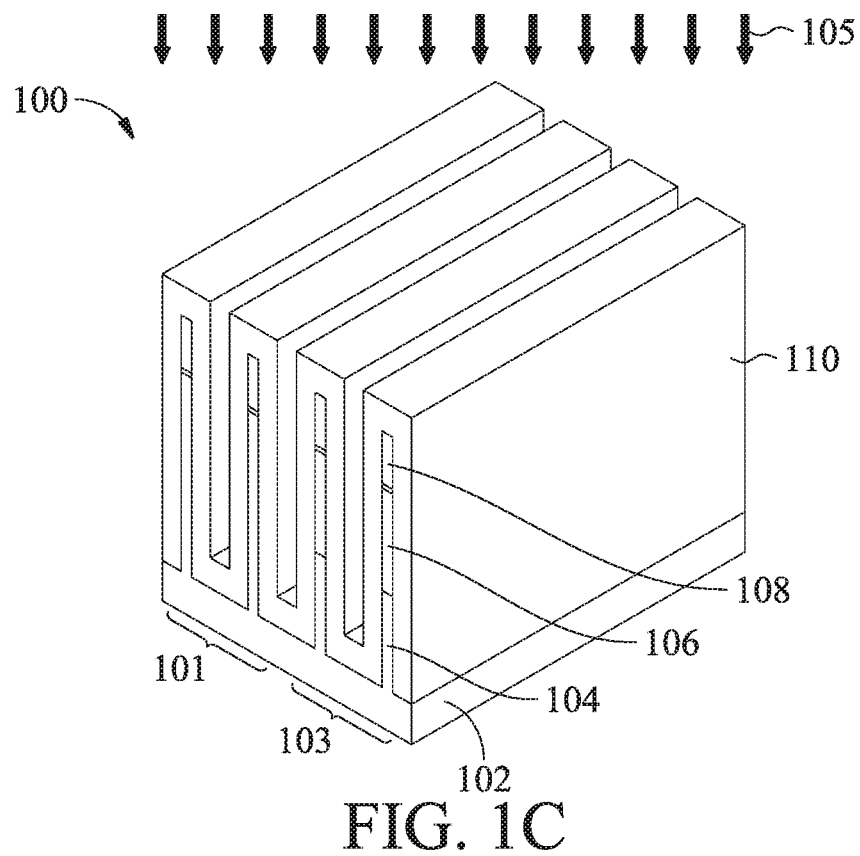
Figure 1D:
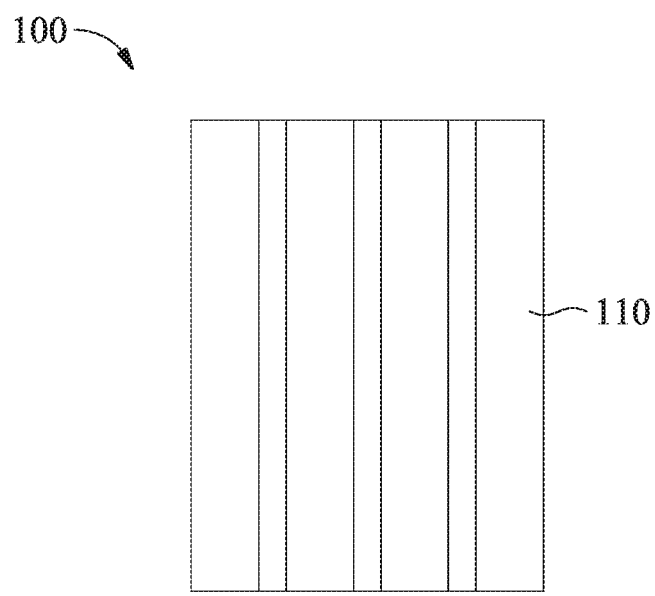

FIG. 1C illustrates a deposition process 105 by which a conforming spacer layer 110 is formed over the fin structures 101, 103. The spacer layer 110 may be an oxide layer such as silicon oxide. FIG. 1D is a top view of the conforming spacer layer 110. The spacer layer 110 may be formed using one of a variety of methods. In one example, the spacer layer 110 is formed using an Atomic Layer Deposition (ALD) process. ALD is a process by which a thin film is grown layer by layer by alternating between different gaseous species. A conformal process, such as ALD is used so that gaps remain between the fin structures 101, 103.

Figure 1E:
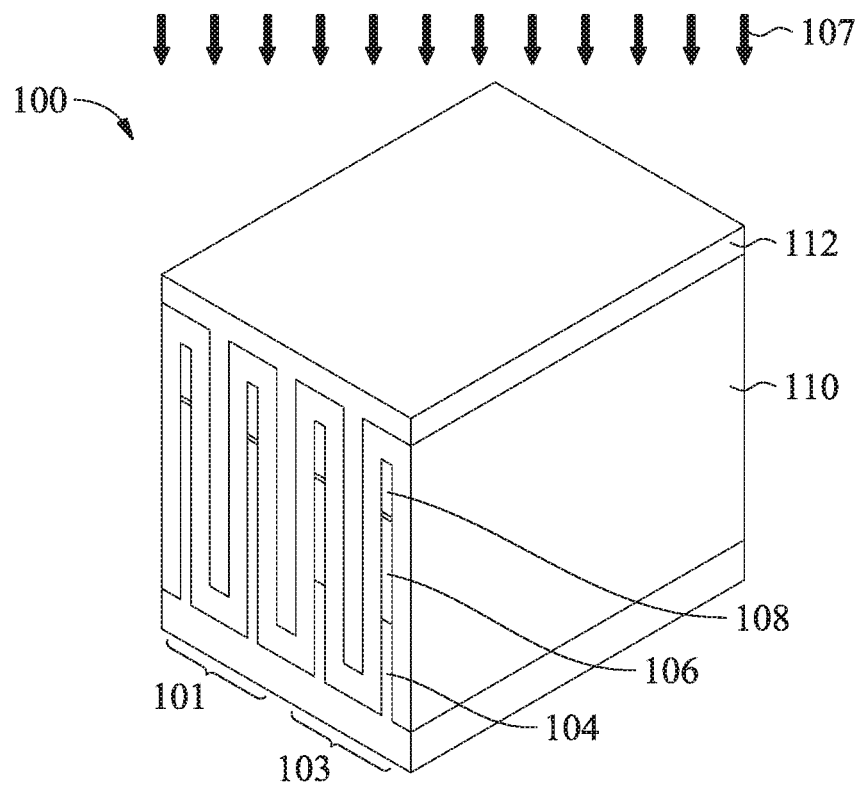
Figure 1F:
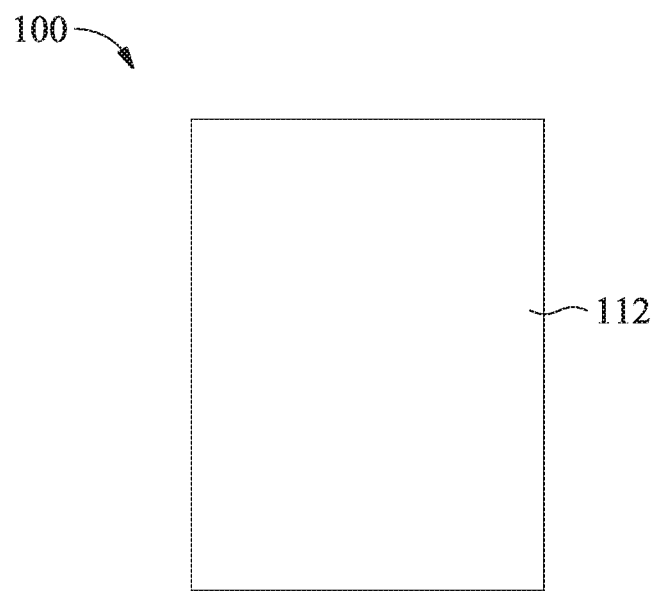

FIG. 1E illustrates the workpiece 100 after a deposition process 107 is applied to form a dummy fin layer 112. The dummy fin layer 112 may include SiCN, SiN, SiOCN and metal oxides, such as HfO2, ZrO2, HfAlOx, HfSiOx. FIG. 1F illustrates a top view of the dummy fin layer 112. The dummy fin layer 112 may be formed using an ALD process. Other fabrication methods are contemplated. The dummy fin layer 112 fills the gaps between the fin structures 101, 103. The dielectric material for the dummy fin layer 112 may be selected so that it can be selectively etched with respect to the spacer layer 110. In other words, the dielectric materials 110, 112 are selected so that one can be etched without substantially affecting the other. The dummy fin layer 112 ultimately forms dummy fins that run parallel with and between the fin structures 101, 103. The dummy fins may have a height within a range of about 12-20 nanometers.

Figure 1G:
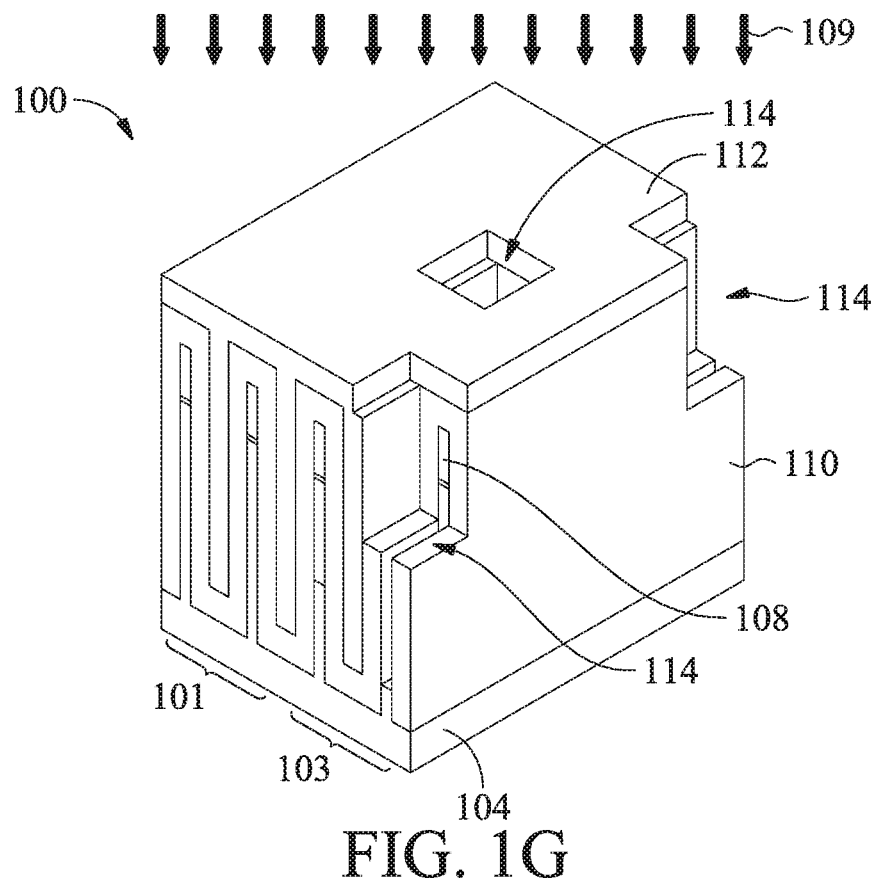
Figure 1H:
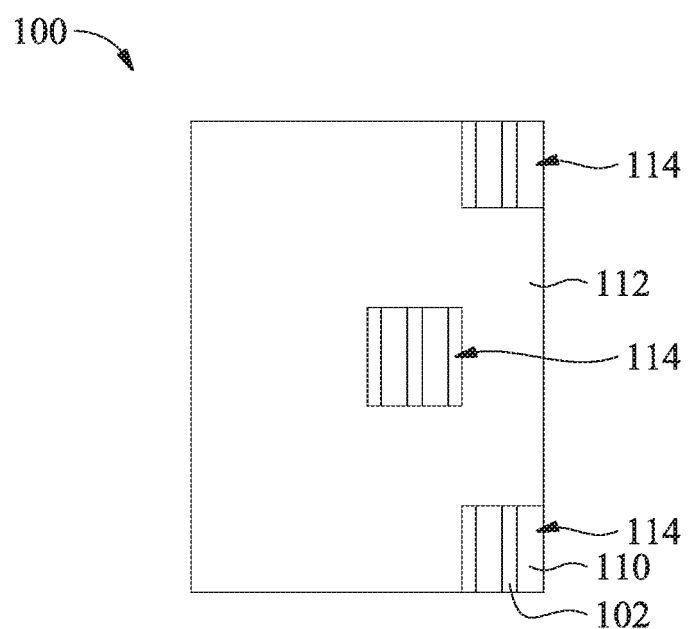

FIG. 1G illustrates the device after a cut process 109 is used to remove portions of the dummy fin layer 112, the spacer layer 110, and the fin structures 103. The cut process 109 results in fin-cut regions 114. The fin-cut regions separate a first portion 103a of a fin structure from a second portion 103b of a fin structure (as illustrated in FIG. 1K). FIG. 1H illustrates a top view of the fin-cut regions 114.

Figure 1I:
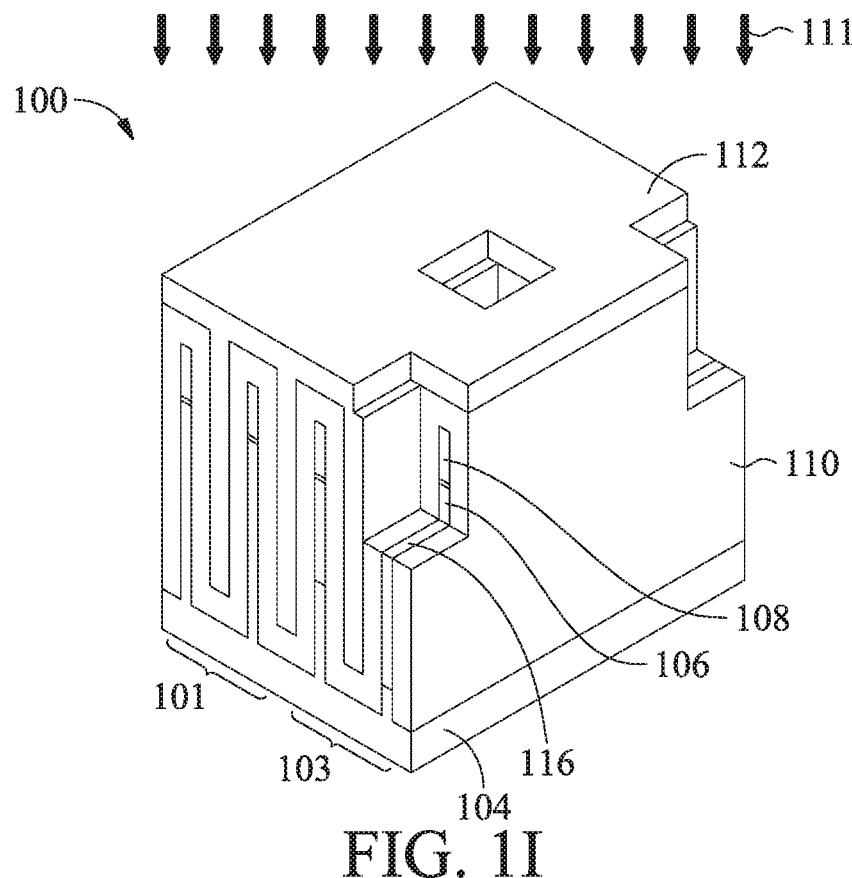
Figure 1J:
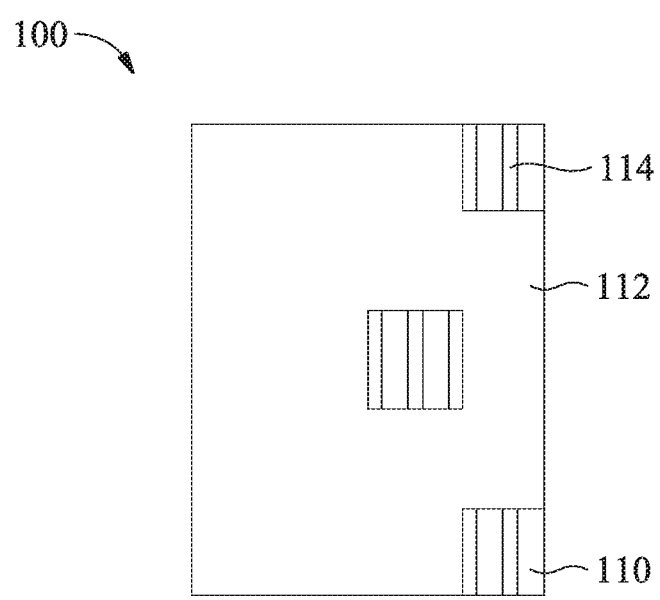
Figure 1K:
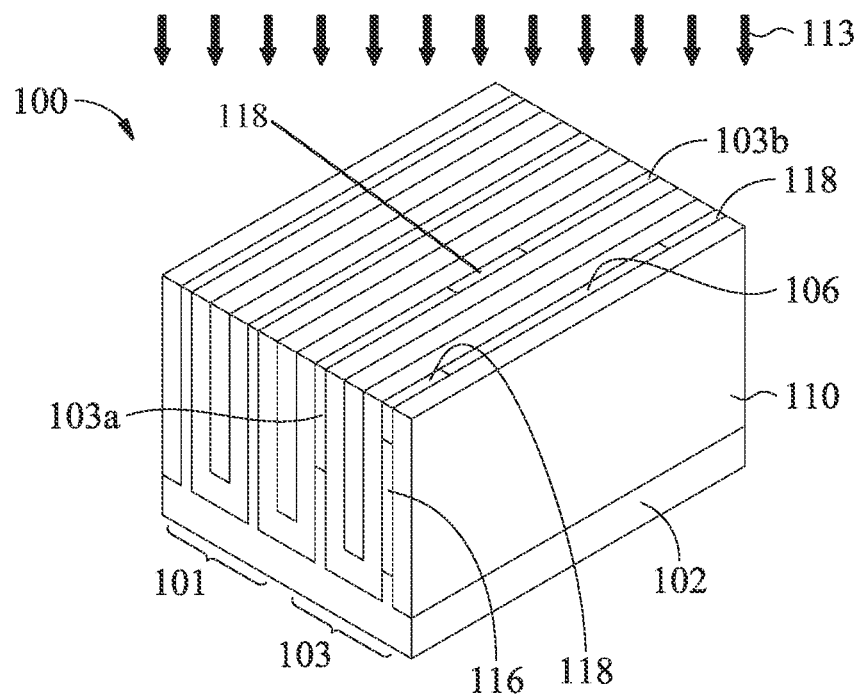

FIG. 1I illustrates the workpiece 100 after a formation process 111 to form a dummy fin structure 116 within the fin-cut region. FIG. 1J illustrates a top view of the dummy fin structure 116. In the present example, the dummy fin structure 116 has a height that is less than that of the fin structure 103. In one example, the dummy fin structure 116 may have a height within a range of 1-30 nanometers. The dummy fin structure 116 may be formed using one of a variety of processes. In one example, the dummy fin structure 116 is formed using an ALD process. The dummy fin structure 116 may be made of a variety of materials. In one example, the dummy fin structure 116 comprises at least one of: SiCN, SiN, SiOCN and metal oxide, such as $HfO_2$, $ZrO_2$, $HfAlO_x$, or $HfSiO_x$.

Figure 1L:
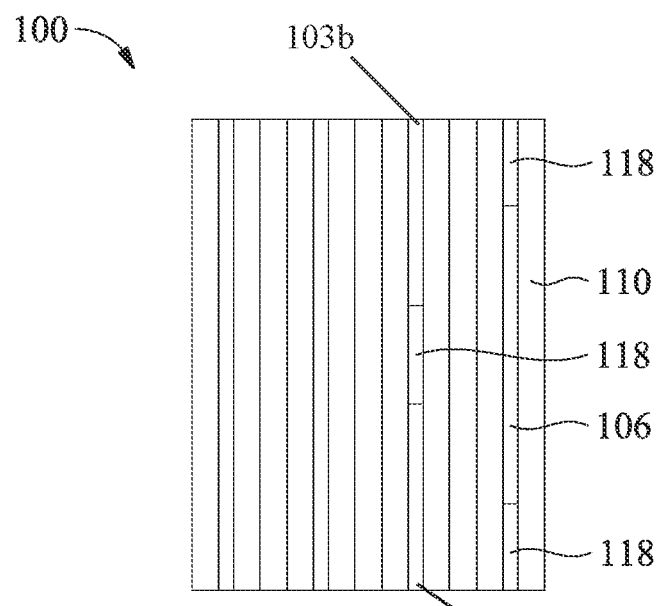

FIG. 1K illustrates the workpiece 100 after a deposition process to form an isolation layer 118 in the gap above the dummy fin structure, and after a Chemical Mechanical Polishing (CMP) process 113 to planarize the workpiece 100. In some examples, the isolation layer 118 is the same type of material as the spacer layer 110. FIG. 1L is a top view of the workpiece 100 after the CMP process. As can be seen, the top surface of the fin structures 103 are exposed.

Figure 1M:
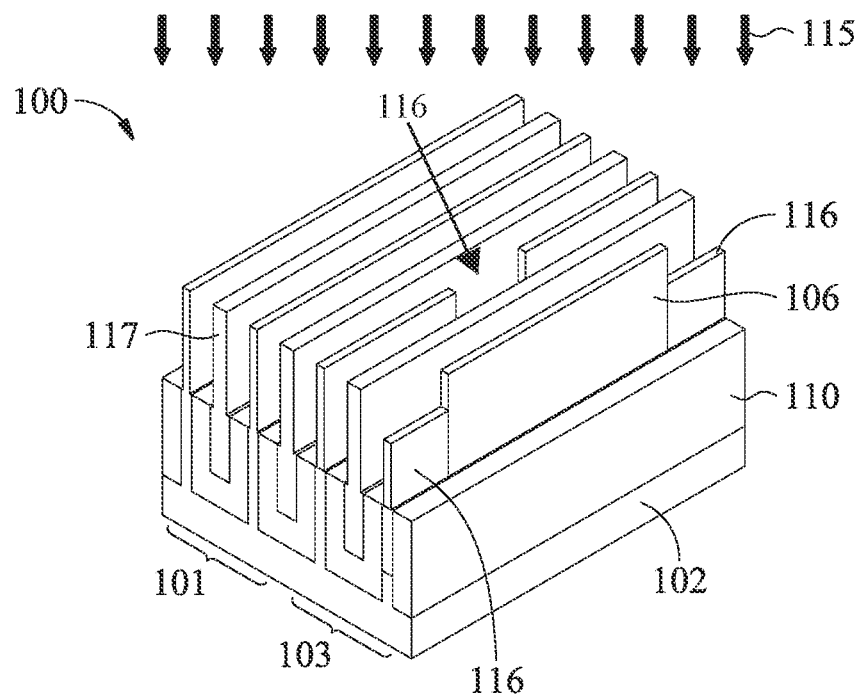
Figure 1N:
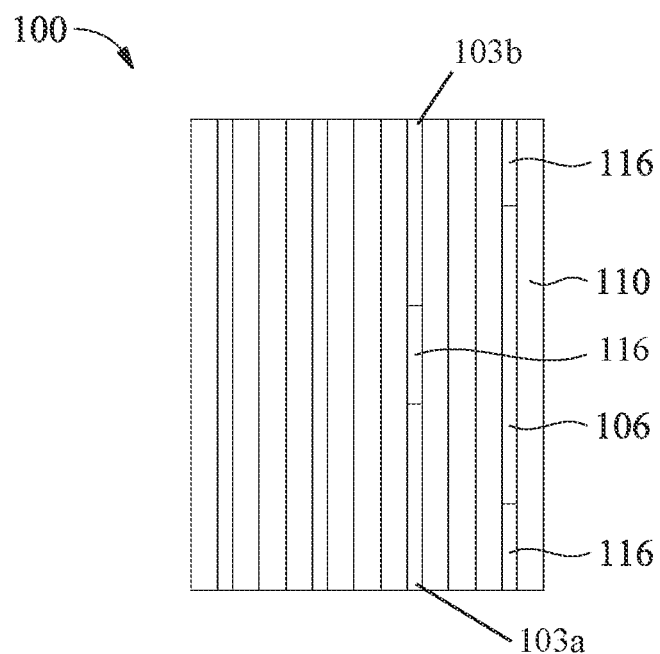

FIG. 1M illustrates the workpiece 100 after an etching process 115 to remove a portion of the spacer layer 110 and the ILD material 118. Doing so exposes the upper portions of the fin structures 101, 103. The etching process also exposes the upper portions of the dummy fins 117 that run parallel with and between the fin structures 101, 103. The etching process 115 may be a dry etching process such as reactive ion etching. The etching process 115, as well as the materials of the spacer layer 110 and dummy fin material 112 are such that the etching process 115 removes the spacer layer 110 while leaving the dummy fin material 112 substantially intact. FIG. 1N illustrates a top view of the workpiece after the etching process 115.

Figure 1O:
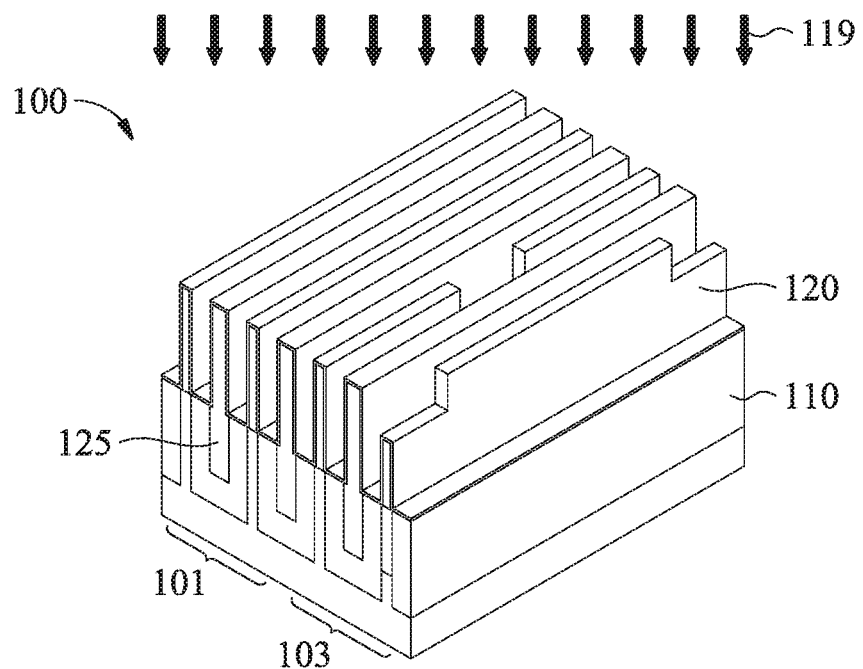
Figure 1P:
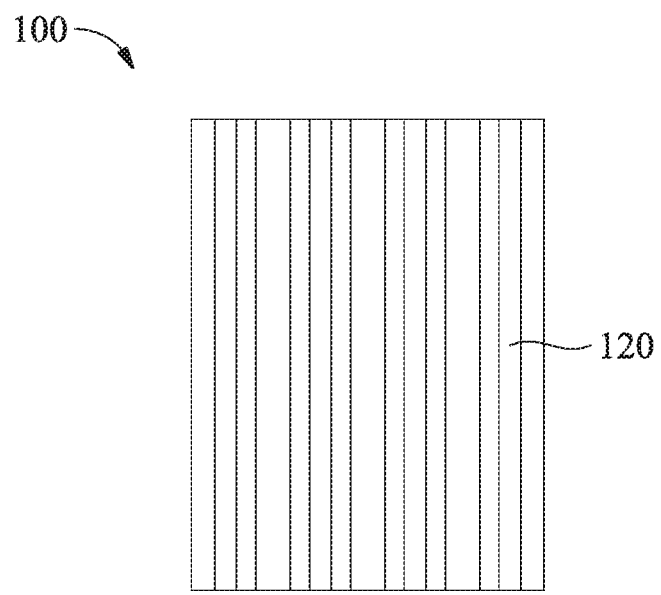

FIG. 1O illustrates the workpiece 100 after a deposition process 119 to form a gate dielectric 120 over the fin structures 101, 103 and the dummy fins 125. The gate dielectric 120 may be a high-k dielectric or an oxide layer. The gate dielectric 120 may be deposited using an ALD process. Other conformal deposition processes are contemplated. FIG. 1P illustrates a top view of the gate dielectric layer 120.

Figure 1Q:
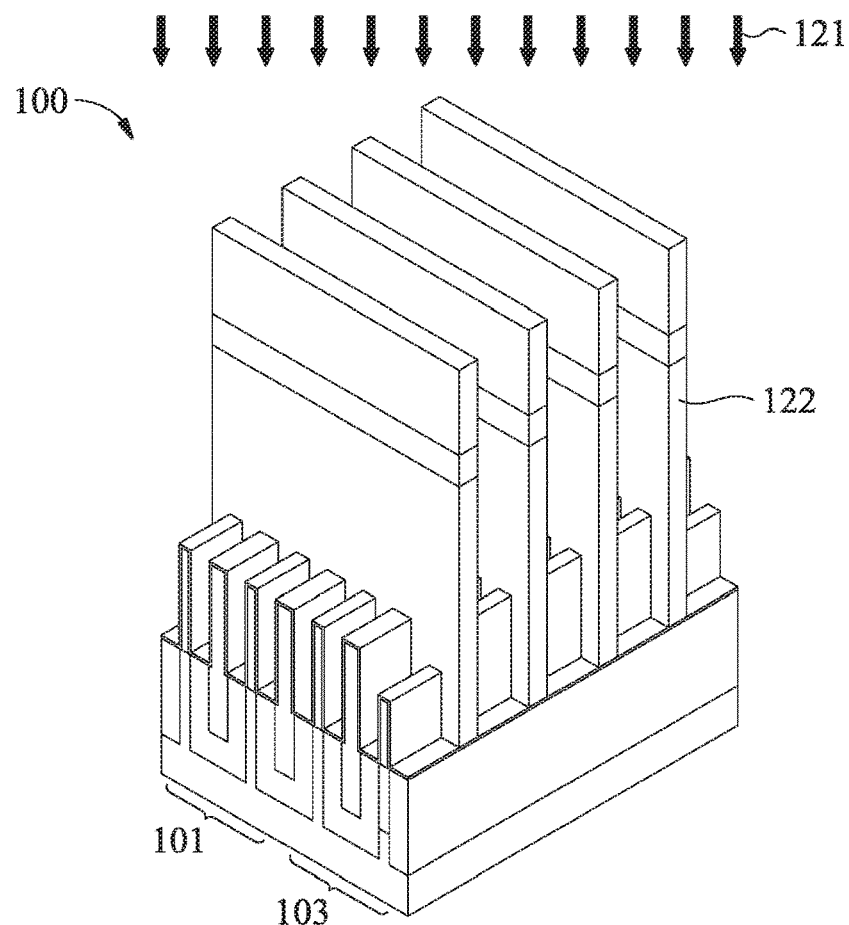
Figure 1R:
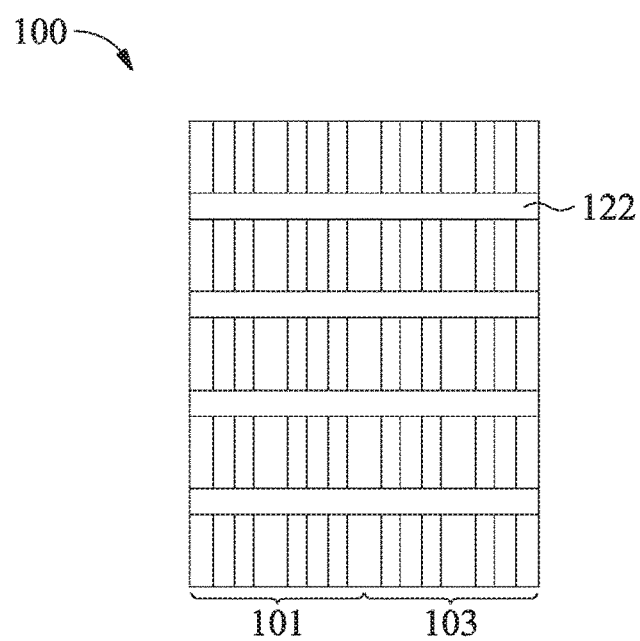

FIG. 1Q illustrates the workpiece 100 after a process 121 to form gate devices 122. The gate devices 122 run perpendicular to the fin structures 101, 103. The gate devices 122 may be made of a conductive material such as metal or polysilicon. The gate devices 122 may be formed using photolithographic processes. For example, layers in a gate stack may be depositing onto the workpiece 100. A photoresist may then be applied onto the gate stack layers. The photoresist may then be exposed to a light source through a photomask to pattern the photoresist. An etching process may then be applied to remove the exposed portions of the gate stack layers. FIG. 1R illustrates a top view of the gate devices 122.

Figure 1S:
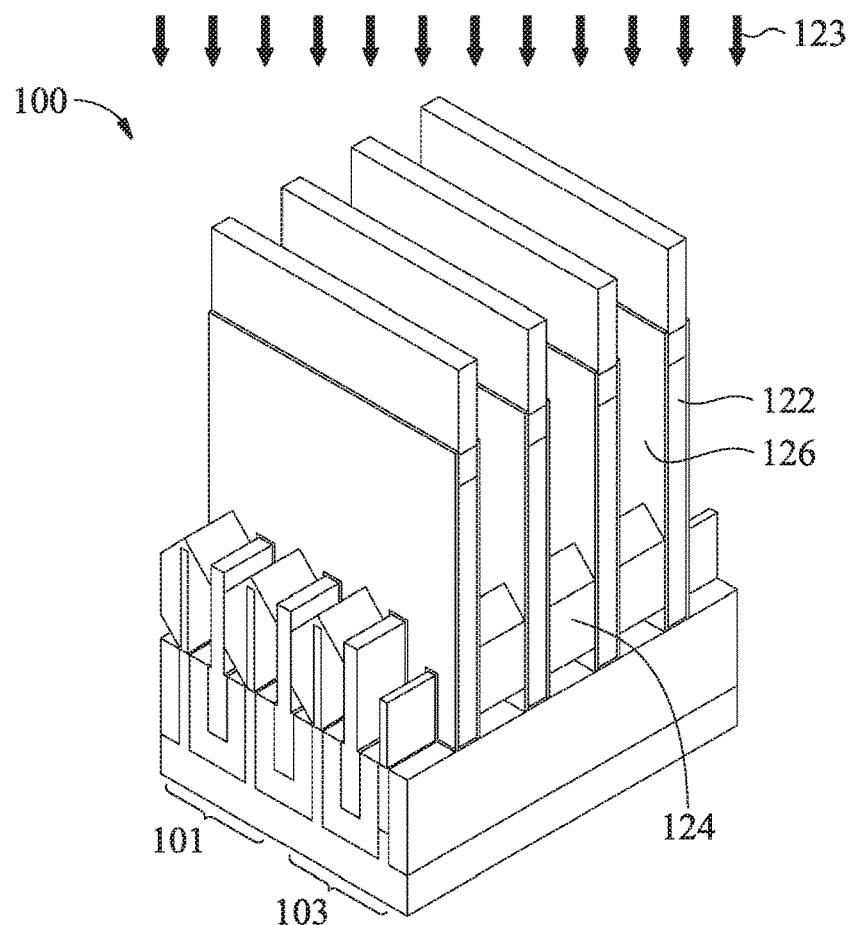
Figure 1T:
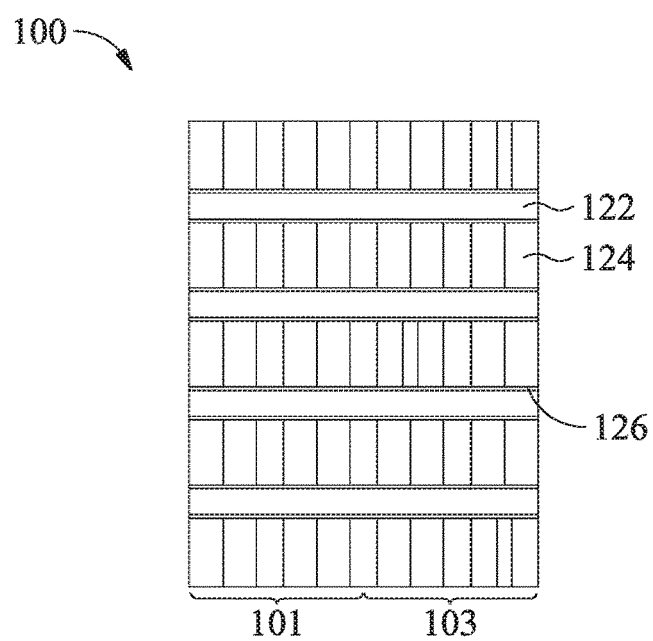

FIG. 1S illustrates an epitaxial process 123 to form source/drain regions 124 on the fin structures 101, 103. The source/drain regions 124 may be formed by an epitaxial growth process. In one example, gate spacers 126 are formed on the sidewalls of the gate devices 122 before the source/drain regions 124 are grown. As can be seen, because the dummy fin structures are dielectric rather than crystalline, the source/drain regions 124 are not formed on the dummy fin structures. FIG. 1T illustrates a top view of the source/drain regions 124. The source/drain regions on both sides of the gate devices may form transistors. In some examples, the transistors are PMOS, such as pull-up transistors of an SRAM cell. In some embodiments, the transistors are NMOS of logic standard cells.

Figure 1U:
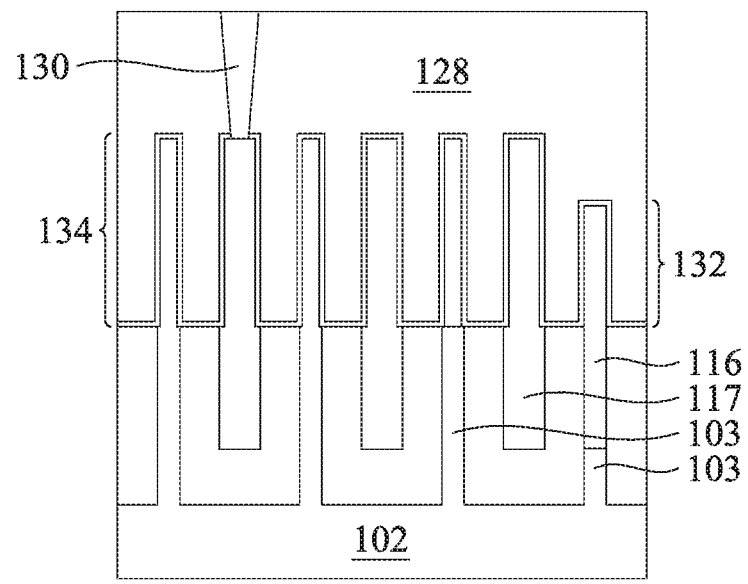
Figure 1V:
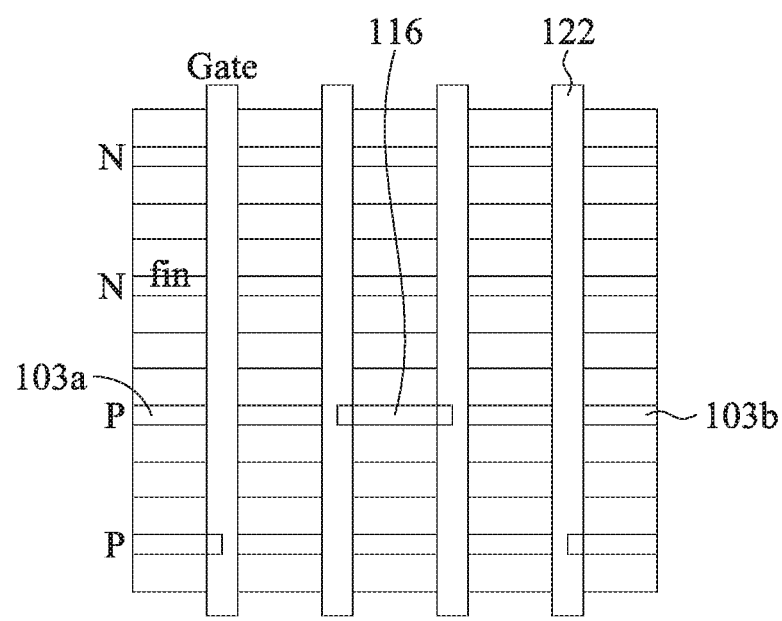

FIG. 1U is a cross-sectional view of the workpiece 100 after contacts 130 and isolation layer 128 have been formed. As can be seen, the height 134 of the dummy fin 117 structure 116 within the fin-cut region is greater than the height 132 of the dummy fin structure 116 fins 117, in light of the fabrication processes described above. However, in some examples, the dummy fin structure 116 may be coplanar with the dummy fins 117. FIG. 1V shows a top view of the workpiece 100 (without isolation layer 128 and contact 130 for illustrative purposes). As can be seen, a dummy fin structure separates a first portion 103a of the fin structure and a second portion 103b of the fin structure. The longitudinal axis of the first portion 103a is aligned with the longitudinal axis of the second portion 103b.

Figure 1W:
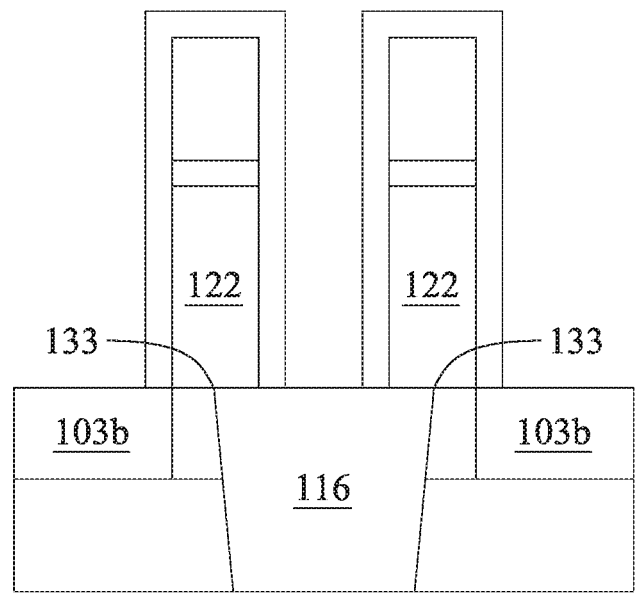
Figure 1X:
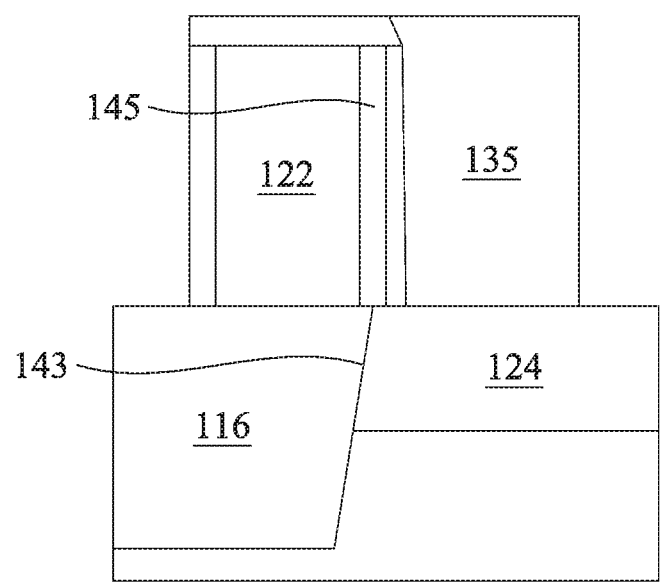

FIGS. 1W and 1X are diagrams showing a cross-sectional view of gate features formed over the dummy fin structure. FIG. 1W illustrates an example in which gate structures 122 with sidewalls 145 straddle the edges 133 of the dummy fin structure 116. FIG. 1X illustrates an example in which the junction 143 between the dummy fin structure 116 and the source/drain region 124 is substantially aligned with gate structure and an adjacent source/drain contact 135.

Figure 2:
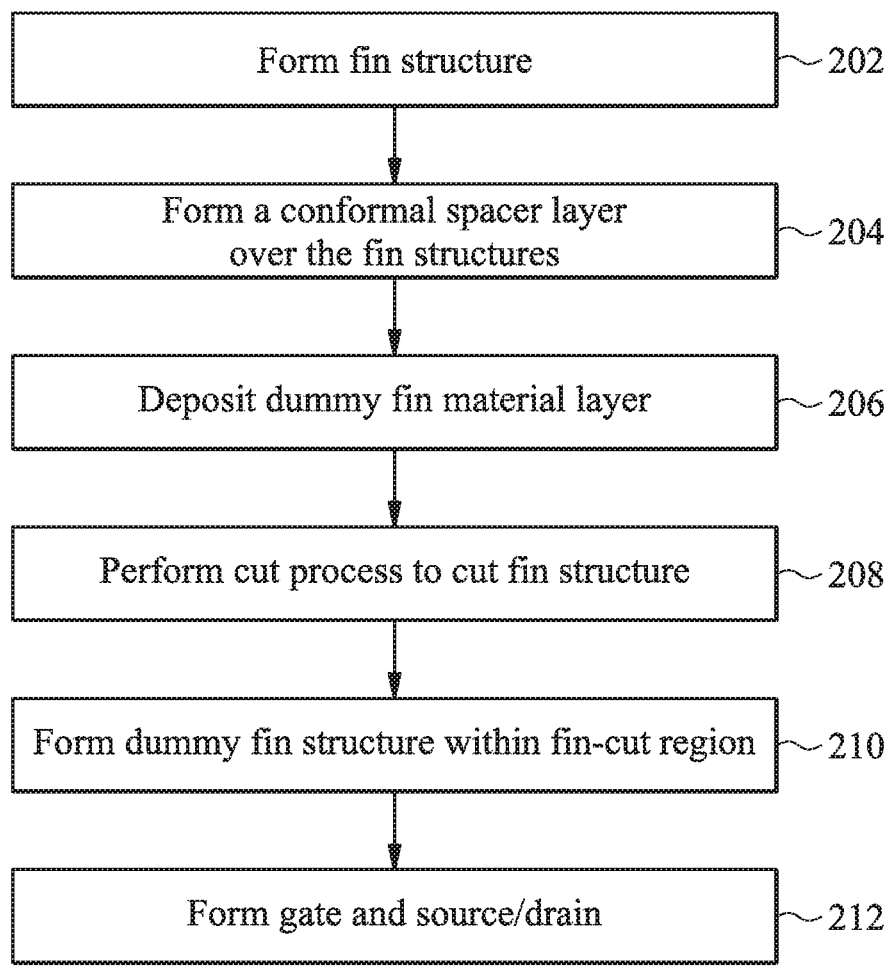
FIG. 2 is a flowchart showing an illustrative method for forming a dummy fin structure within a fin-cut region, according to one example of principles described herein.

FIG. 2 is a flowchart showing an illustrative method 200 for forming a dummy fin structure within a fin-cut region. According to the present example, the method 200 includes a process 202 for forming a fin structure. In one example, the fin structure may be for a PMOS device. The fin structure may correspond to one of the fin structures 103 shown in FIG. 1A. The fin structure may be formed on a substrate. The PMOS fin structure may include a lower portion and an upper portion. In one example, the lower portion is made of the same type of semiconductor material as the substrate 102. For example, if it is a silicon substrate, then the silicon lower portion of the PMOS fin structure may be silicon. The upper portion of the fin structure may include a different semiconductor material such as silicon germanium. The fin structure may be formed in a variety of manners. In one example, the fin structure may be formed by using photolithographic techniques to pattern the semiconductor substrate and perform an etching process that defines the fin structure. Additionally, an epitaxial growth process may be applied to form the upper portion (e.g., 106) of the fin structure.

The method 200 further includes a step 204 for forming a conformal spacer layer (e.g., 110, FIG. 1C) over the fin structures. The spacer layer may be formed using one of a variety of methods. In one example, the spacer layer is formed using an Atomic Layer Deposition (ALD) process. A conformal process, such as ALD is used so that gaps remain between the fin structures.

The method 200 further includes a step 206 for depositing a dummy fin layer (e.g., 112, FIG. 1E). The dummy fin layer may be formed using an ALD process. The dummy fin layer fills the gaps between the fin structures. The dielectric material for the dummy fin layer may be selected so that it can be selectively etched with respect to the spacer layer 110. In other words, the dielectric materials are selected so that one can be etched without substantially affecting the other.

The method further includes a step 208 for performing a cut process to cut the fin structure. The cut process may involve one or more etching steps to etch various materials. For example, the cut process involves removing the conformal spacer layer 110 to a first depth. The cut process also includes removing the fin structure to second depth that is deeper than the first depth. The cut process results in fin-cut regions that separate one portion (e.g., 103a, FIG. 1V) from another portion (e.g., 103b, FIG. 1V).

The method 200 further includes a step 210 for forming a dummy fin structure (e.g., 116, FIG. 1I) in the fin-cut region. In the present example, the dummy fin structure has a height that is less than that of the fin structure. The dummy fin structure may be formed using one of a variety of processes. In one example, the dummy fin structure is formed using an ALD process. The dummy fin structure may be made of a variety of materials. In one example, the dummy fin structure comprises at least one of: SiCN, SiN, SiOCN and metal oxide, such as $HfO_2$, $ZrO_2$, $HfAlO_x$, or $HfSiO_x$.

The method 200 further includes a step 212 for forming gates and source/drain regions. Before the gates and source/drain regions are formed, a deposition process is applied to form an isolation layer in the gap above the dummy fin structure. Then, a CMP process is used to planarize the workpiece. Next, an etching process is used to remove a portion of the spacer layer and the ILD material to expose the upper portions of the fin structures. The etching process also exposes the upper portions of the dummy fins that run parallel with and between the fin structures. The gates run perpendicular to the fin structure and may be formed using a plurality of deposition processes to form a gate stack, starting with a gate dielectric (e.g., 120, FIG. 1O). After the gates have been formed. Sidewall spacers may be formed on the gates. Then, the source/drain regions may be formed within the fin structures adjacent the gates. The source/drain regions may be formed using an epitaxial process.

Figure 3A:
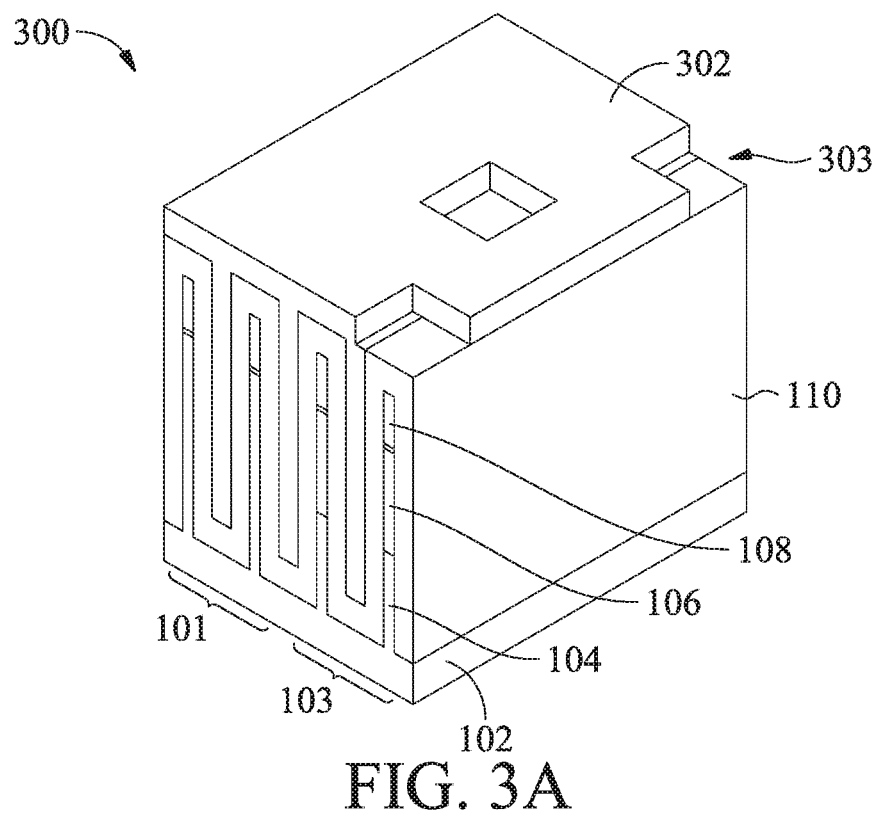
FIGS. 3A, 3B, 3C, 3D, 3E, 3F, 3G, 3H, 3I, 3J, 3K, and 3L are diagrams showing cross-sectional and top views of a process for forming a bulk dummy structure within a fin-cut region, according to one example of principles described herein.
Figure 3B:
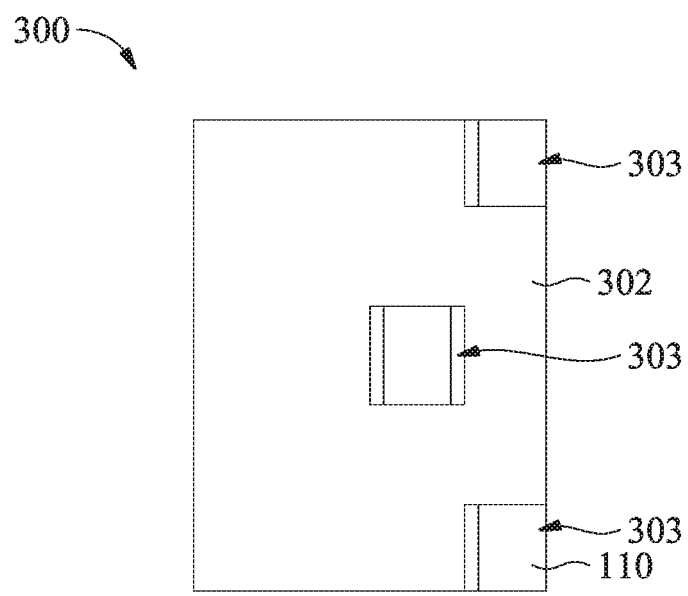

FIGS. 3A, 3B, 3C, 3D, 3E, 3F, 3G, 3H, 3I, 3J, 3K 3L, are diagrams showing cross-sectional and top views of a process for forming a bulk dummy structure within a fin-cut region. FIG. 3A illustrates a workpiece 300 after a patterned dummy layer 302 is formed. The steps before those to form the patterned dummy layer may be similar to those described in FIGS. 1A-1D. Forming the patterned dummy layer may involve a deposition process and a patterning process. The deposition process may be an ALD process to deposit the dummy layer material between fin structures 101, 103. Other fabrication processes are contemplated. The patterning process may involve various photolithographic processes to remove portions 303 of the dummy layer corresponding to where the fin structures 103 will be cut. FIG. 3B illustrates a top view of the workpiece 300 after deposition of the dummy layer 302 but before patterning the dummy layer 302.

Figure 3C:
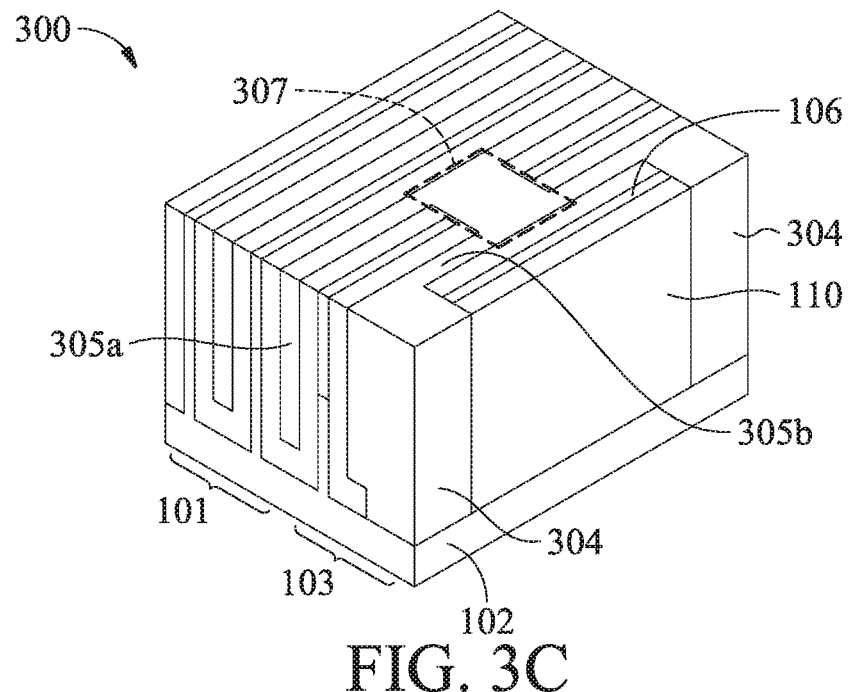

FIG. 3C illustrates the workpiece 300 after the fin structures 103 have been cut, a dummy material 304 is deposited within the space left by the fin-cut process, and a CMP process is performed. The cut process may include an etching process. Specifically, photolithographic techniques may be used to apply a patterned hard mask that exposes the fin-cut regions to the etching process while preventing other regions from being affected by the etching process.

Figure 3D:
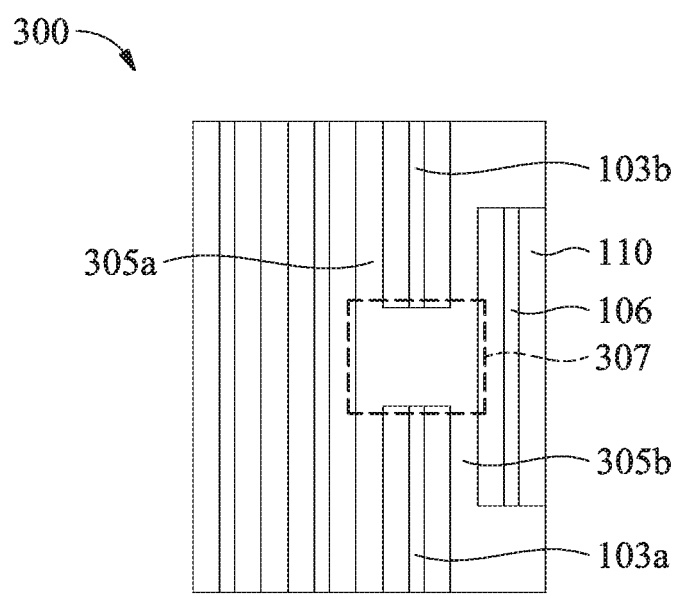

FIG. 3D illustrates a top view after such processes have been performed. The fin-cut process may include an etching process designed to remove the portions of the fin structures exposed through the patterned dummy layer 302 all the way to the substrate 102. The holes left by such an etching process may then be filled with a dummy material 304. This may be the same type of material used to form the patterned dummy layer 302.

As can be seen in the top view, cutting the fin structures 103 and depositing the dummy layer in such a manner results in a bulk dummy structure 307 extending between two adjacent dummy fins 305a, 305b. The bulk dummy structure 307 may have a height within a range of about 12-20 nanometers. The bulk dummy structure 307 also extends between a first portion 103a of the fin structure and a second portion 103b of the fin structure. The portions 103a, 103b may be functional fin structures (i.e., not dummy structures).

Figure 3E:
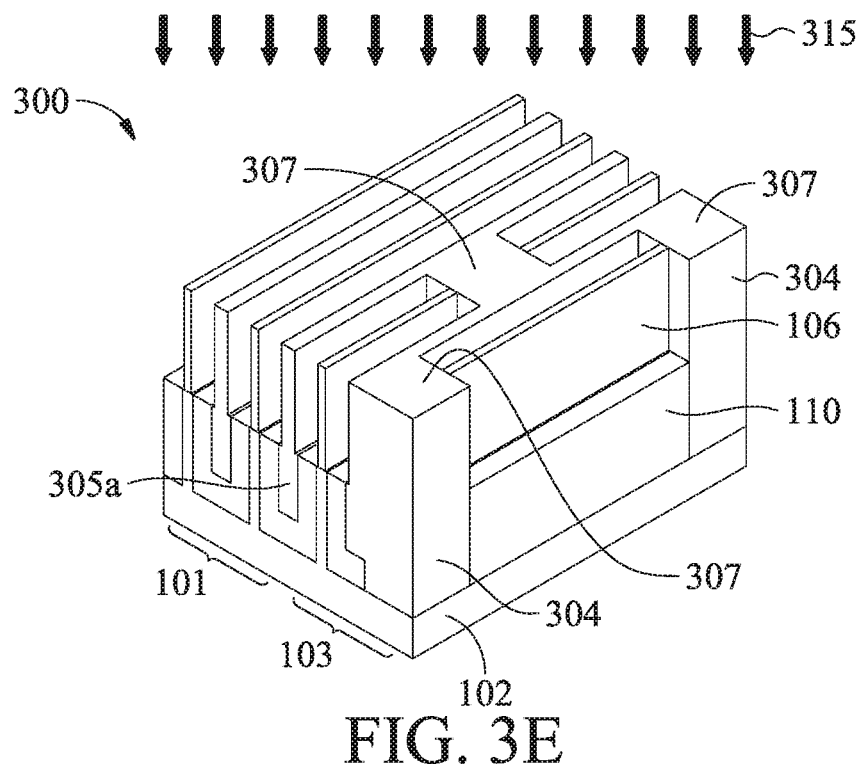
Figure 3F:
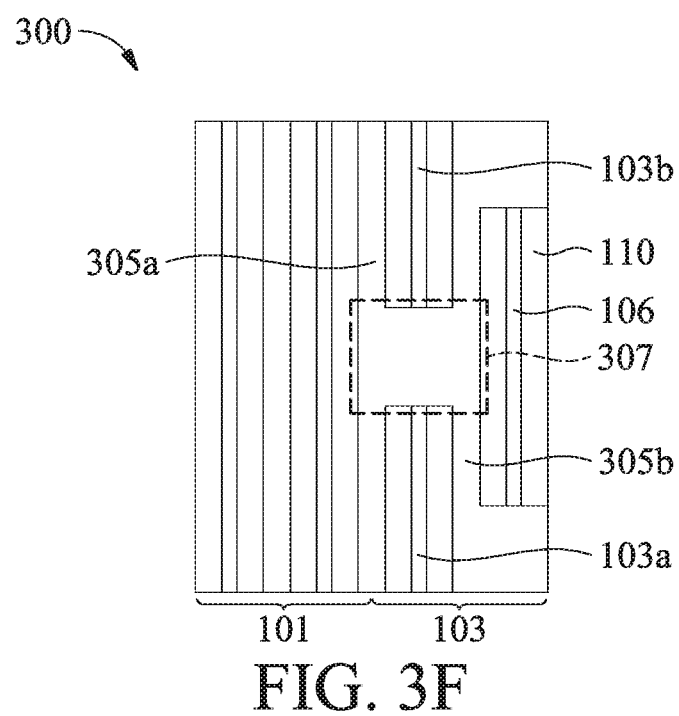

FIG. 3E illustrates an etching process 315 to expose the upper portions of the fin structures 103, dummy fins 305a, 305b, and bulk dummy structures 307. In one example, the etching process 315 is a dry etching process such as a reactive ion etching process. The etching process 315 as well as the materials for the spacer layer 110 and dummy layer 302 are selected so that the etching process 315 removes the spacer layer without substantially affecting the dummy layer 302 and the fin structures 103. FIG. 3F illustrates a top view of the workpiece 300.

Figure 3G:
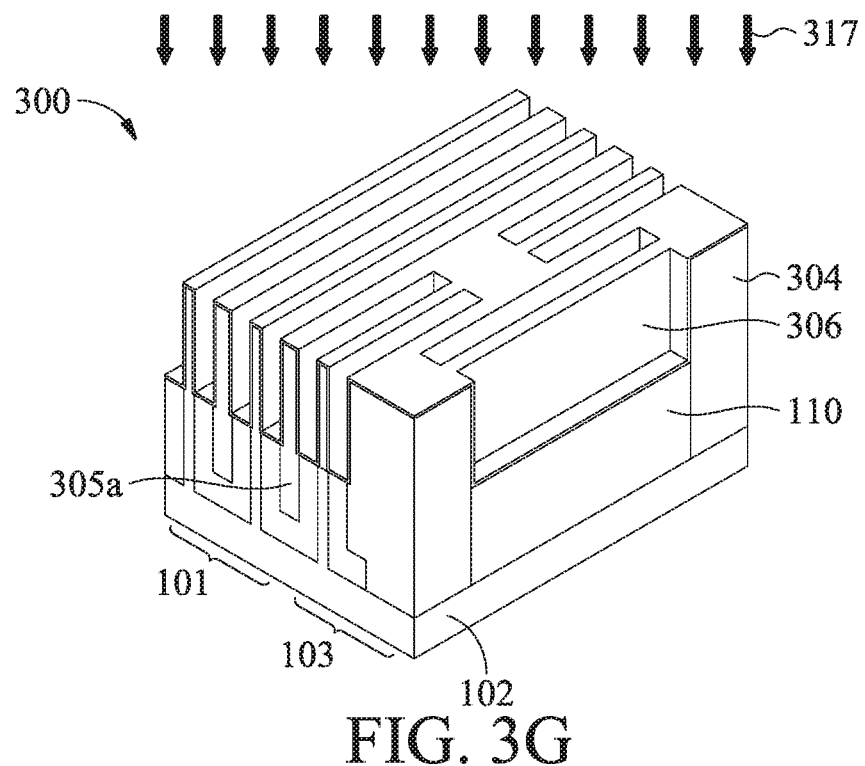
Figure 3H:
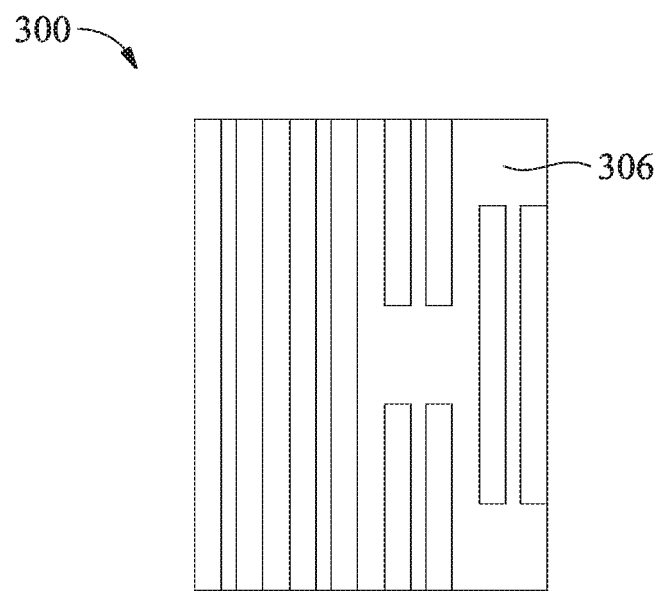

FIG. 3G illustrates the workpiece 300 after a deposition process 317 to form a gate dielectric 306 over the fin structures 101, 103 and the dummy fins 305. The gate dielectric 306 may be a high-k dielectric. In some examples, gate dielectric 306 includes silicon oxide. The gate dielectric 306 may be deposited using an ALD process. Other conformal deposition processes are contemplated. FIG. 3H illustrates a top view of the gate dielectric layer 306.

Figure 3I:
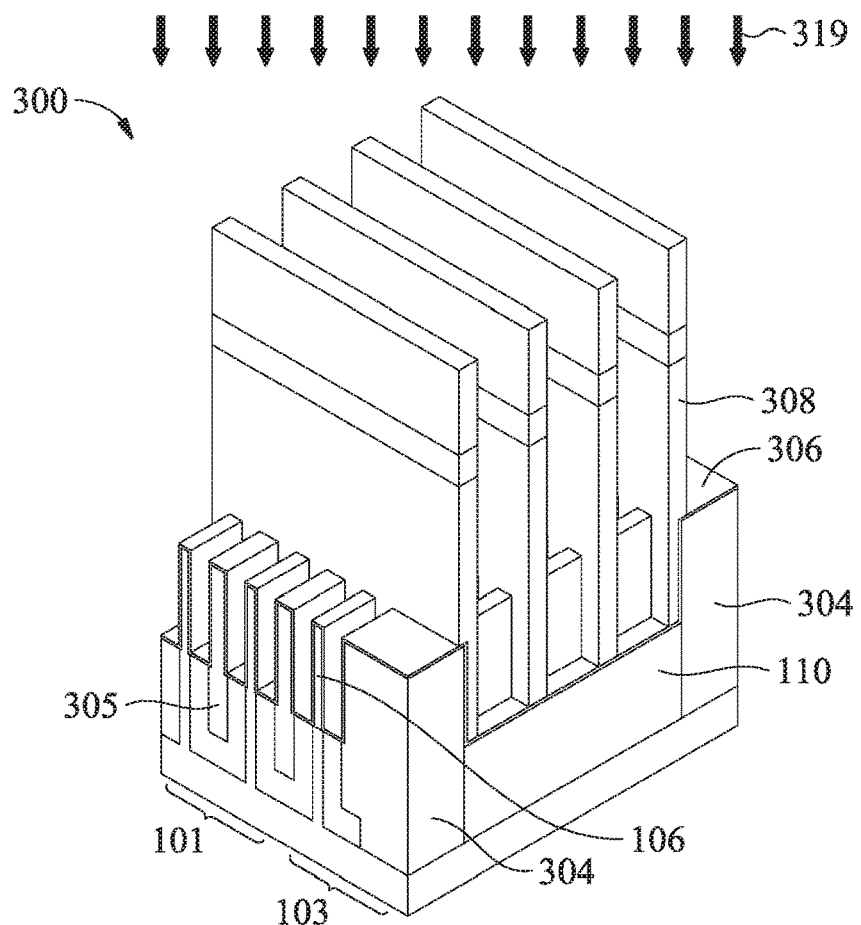
Figure 3J:
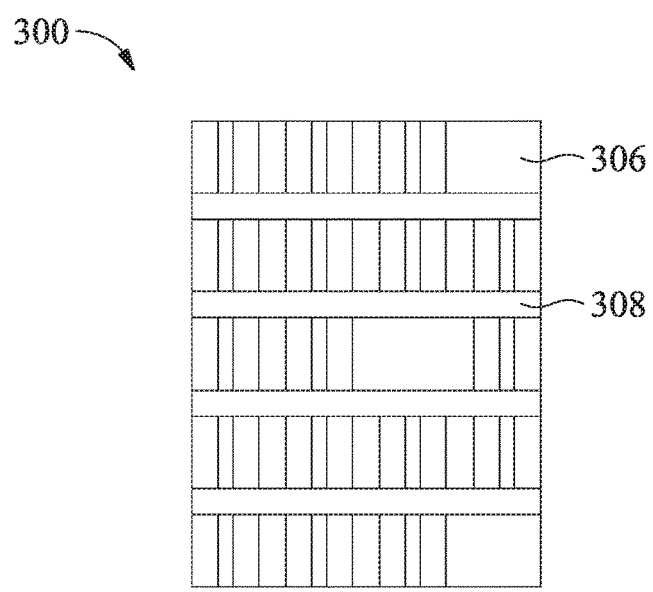

FIG. 3I illustrates the workpiece 100 after a process 319 to form gate devices 308. The gate devices 308 run perpendicular to the fin structures 101, 103. The gate devices 308 may be made of a conductive material such as metal or polysilicon. The gate devices 308 may be formed using photolithographic processes. For example, layers in a gate stack may be depositing onto the workpiece 300. A photoresist may then be applied onto the gate stack layers. The photoresist may then be exposed to a light source through a photomask to pattern the photoresist. An etching process may then be applied to remove the exposed portions of the gate stack layers. FIG. 3J illustrates a top view of the gate devices 308. After the gate devices 308 are formed, the source/drain regions may be formed similar to the processes described in the text above accompanying FIG. 1S.

Figure 3K:
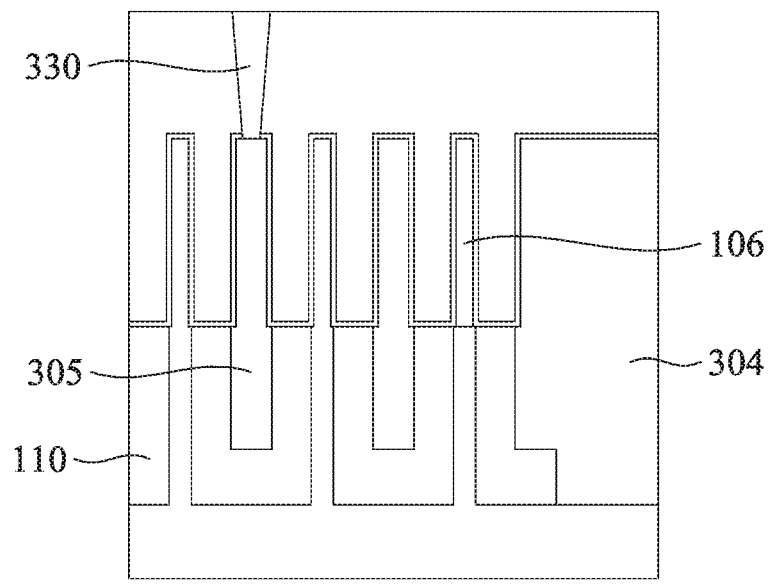
Figure 3L:
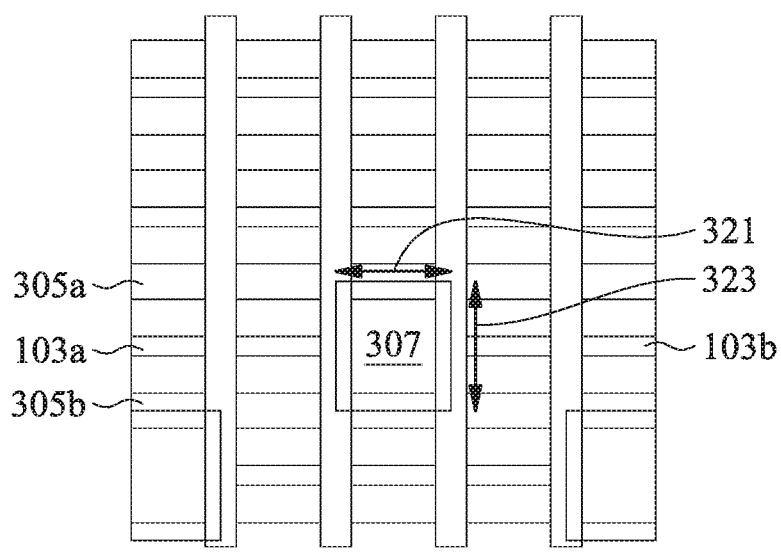

FIG. 3K is a cross-sectional view of the workpiece 300 after contacts 330 have been formed. As can be seen, the top surfaces of the dummy fins 305 and fin structures 103 are coplanar. FIG. 3L shows a top view of the workpiece 300. As can be seen, the bulk dummy structure 307 separates a first portion 103a of the fin structure and a second portion 103b of the fin structure. The bulk dummy structure 307 also extends between dummy fins 305a, 305b. The bulk dummy structure 307 may have a first dimension 321 within a range of about 36-52 nanometers. The bulk dummy structure 307 may have a second dimension 323 within a range of about 40-66 nanometers.

Figure 4:
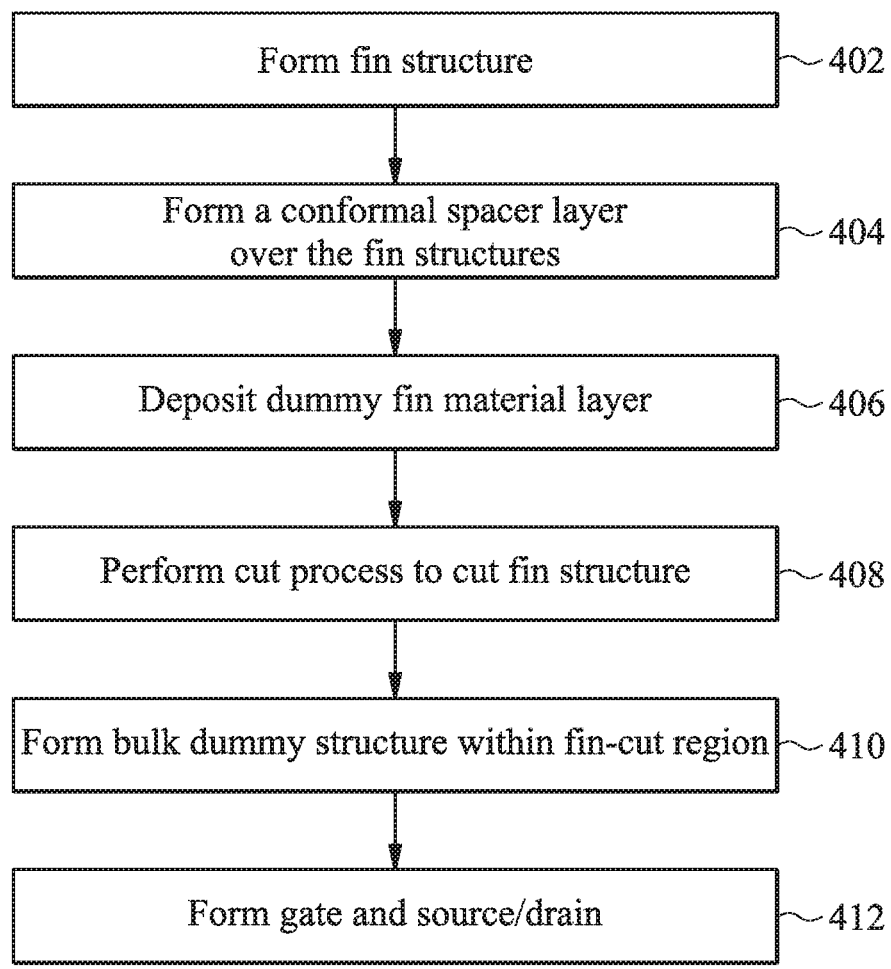
FIG. 4 is a flowchart showing an illustrative method for forming a bulk dummy structure within a fin-cut region, according to one example of principles described herein.

FIG. 4 is a flowchart showing an illustrative method 400 for forming a bulk dummy structure within a fin-cut region. According to the present example, the method 400 includes a process 402 for forming a fin structure. In one example, the fin structure may be for a PMOS device. The fin structure may correspond to one of the fin structures 103 shown in FIG. 1A. The fin structure may be formed on a substrate. The PMOS fin structure may include a lower portion and an upper portion. In one example, the lower portion is made of the same type of semiconductor material as the substrate 102. For example, if it is a silicon substrate, then the silicon lower portion of the PMOS fin structure may be silicon. The upper portion of the fin structure may include a different semiconductor material such as silicon germanium. The fin structure may be formed in a variety of manners. In one example, the fin structure may be formed by using photo-lithographic techniques to pattern the semiconductor substrate and perform an etching process that defines the fin structure.

The method 400 further includes a step 404 for forming a conformal spacer layer (e.g., 110, FIG. 1C) over the fin structures. The spacer layer may be formed using one of a variety of methods. In one example, the spacer layer is formed using an Atomic Layer Deposition (ALD) process. A conformal process, such as ALD is used so that gaps remain between the fin structures.

The method 400 further includes a step 406 for depositing a dummy fin layer (e.g., 304, FIG. 13A). The dummy fin layer may be formed using an ALD process. The dummy fin layer fills the gaps between the fin structures. The dielectric material for the dummy fin layer may be selected so that it can be selectively etched with respect to the spacer layer 110. In other words, the dielectric materials are selected so that one can be etched without substantially affecting the other.

The method 400 further includes a step 408 for performing a cut process to cut the fin structure. The cut process may involve one or more etching steps to etch various materials. For example, the cut process involves removing the conformal spacer layer 110 and the fin structure 103 to a particular depth. The cut process results in fin-cut regions that separate one portion (e.g., 103a, FIG. 3L) from another portion (e.g., 103b, FIG. 3L). The fin-cut regions also extend between dummy fins (e.g., 305a, 305b, FIG. 3L) as well.

The method 400 further includes a step 410 for forming a bulk dummy structure (e.g., 307, FIG. 3C) in the fin-cut region. The bulk dummy structure may be formed using one of a variety of processes. In one example, the dummy fin structure is formed using an ALD process. The bulk dummy structure may be made of a variety of materials. In one example, the dummy fin structure comprises at least one of: SiCN, SiN, SiOCN and metal oxide, such as $HfO_2$, $ZrO_2$, $HfAlO_x$, or $HfSiO_x$. In some examples, the bulk dummy fin structure is in direct contact with the underlying substrate 102.

The method 400 further includes a step 412 for forming gates and source/drain regions. Before the gates and source/drain regions are formed, a deposition process is applied to form an isolation layer in the gap above the dummy fin structure. Then, a CMP process is used to planarize the workpiece. Next, an etching process is used to remove a portion of the spacer layer and the ILD material to expose the upper portions of the fin structures. The etching process also exposes the upper portions of the dummy fins that run parallel with and between the fin structures. The gates run perpendicular to the fin structure and may be formed using a plurality of deposition processes to form a gate stack, starting with a gate dielectric. After the gates have been formed. Sidewall spacers may be formed on the gates. Then, the source/drain regions may be formed within the fin structures adjacent the gates. The source/drain regions may be formed using an epitaxial process.

Figure 5A:
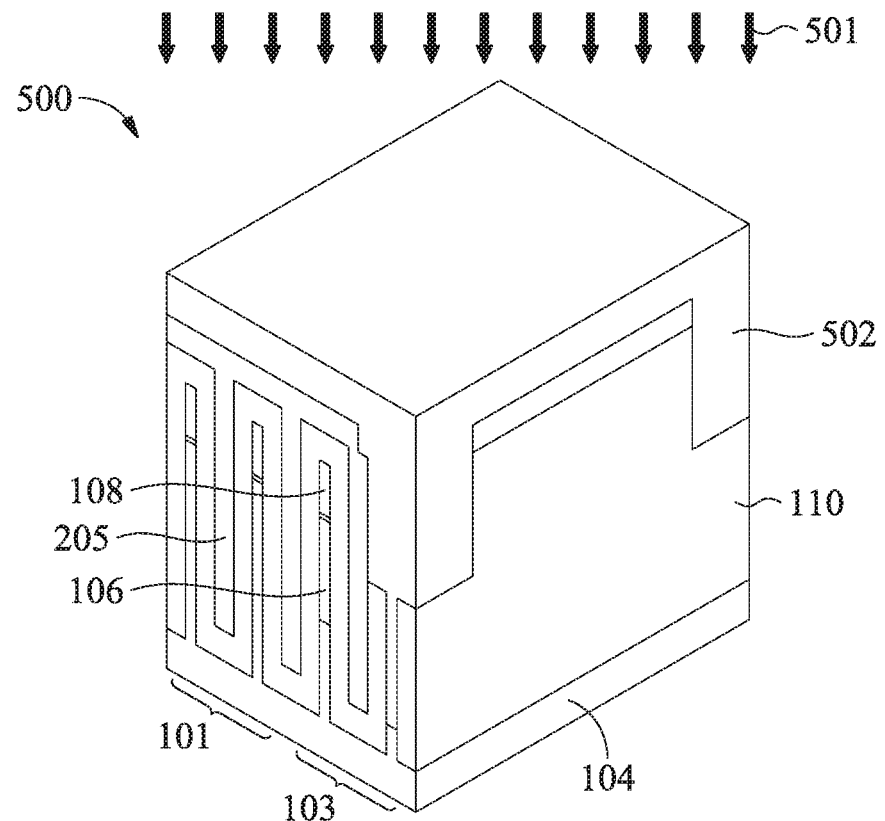
FIGS. 5A, 5B, 5C, 5D, 5E, 5F, 5G, 5H, 5I, 5J, and 5K are diagrams showing cross-sectional and top views of a process for forming a gate extensions within a fin-cut region, according to one example of principles described.
Figure 5B:
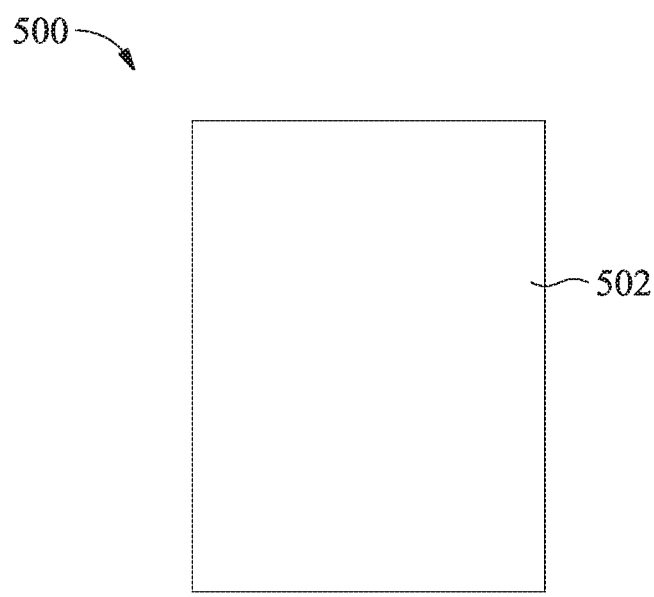

FIGS. 5A, 5B, 5C, 5D, 5E, 5F, 5G, 5H, 5I, 5J, and 5K are diagrams showing cross-sectional and top views of a process for forming a gate extensions within a fin-cut region. FIG. 5A illustrates a workpiece 500 after an ILD layer 502 is deposited within fin-cut regions. FIG. 5B illustrates a top view of the ILD layer 502. The ILD layer may be formed using a variety of processes. In one example, the deposition process 501 used to form the ILD layer 502 is an ALD process. The ILD layer 502 may include a dielectric material such as a nitride or oxide material.

Figure 5C:
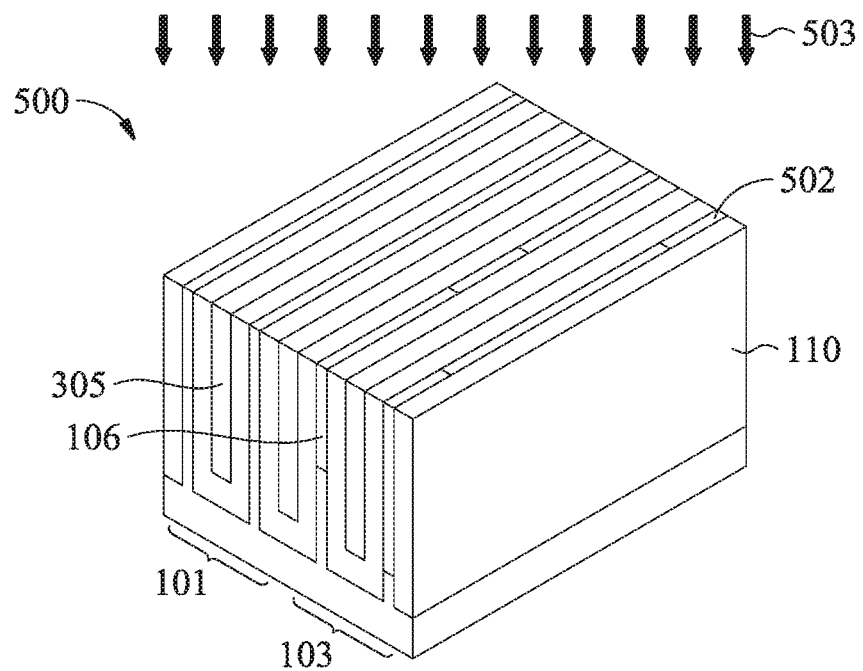
Figure 5D:
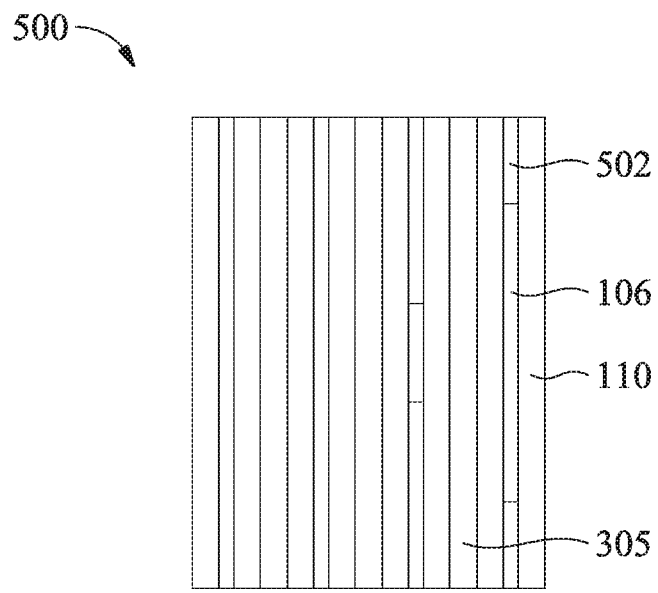

FIG. 5C illustrates the workpiece 500 after a CMP process 503 is performed to planarize the workpiece 500. The CMP process 503 exposes the top surfaces of the dummy fins 305, the fin structures 101, 103, and the ILD material 502 formed within the fin-cut regions. FIG. 5D illustrates a top view of the workpiece 500 after the CMP process 503.

Figure 5E:
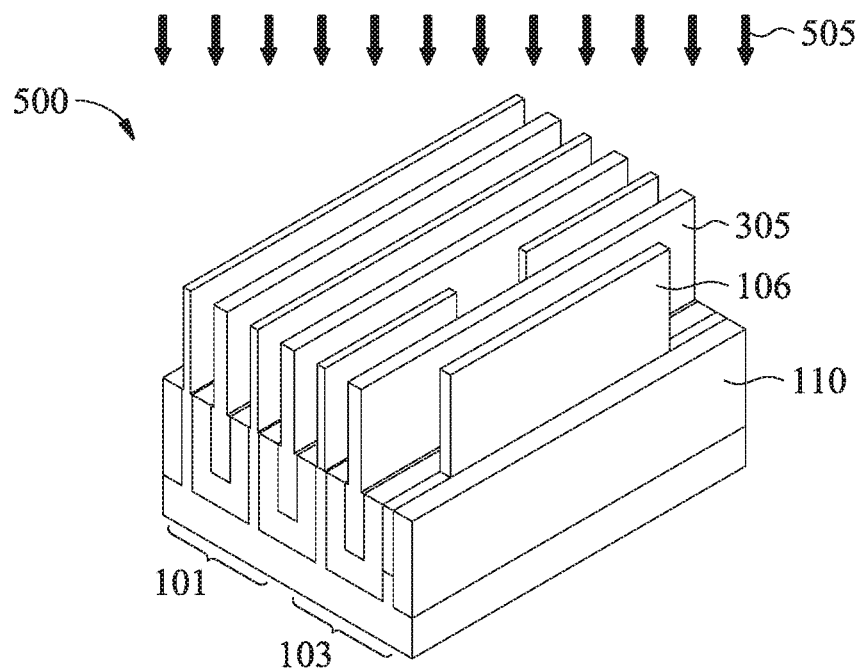
Figure 5F:
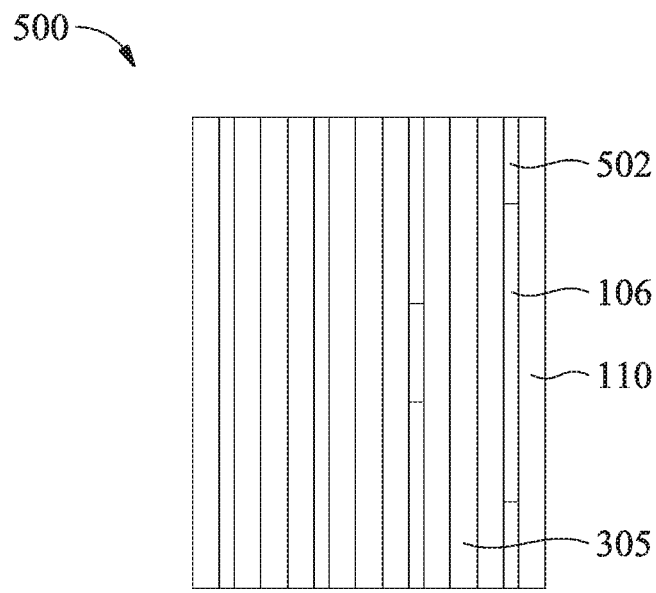

FIG. 5E illustrates the workpiece 500 after an etching process 505 is applied to partially remove the ILD 502 and spacer layer 110. The etching process 505 exposes the upper portions of the fin structures 101, 103 and the dummy fins 305. FIG. 5F illustrates a top view of the workpiece after the etching process 505.

Figure 5G:
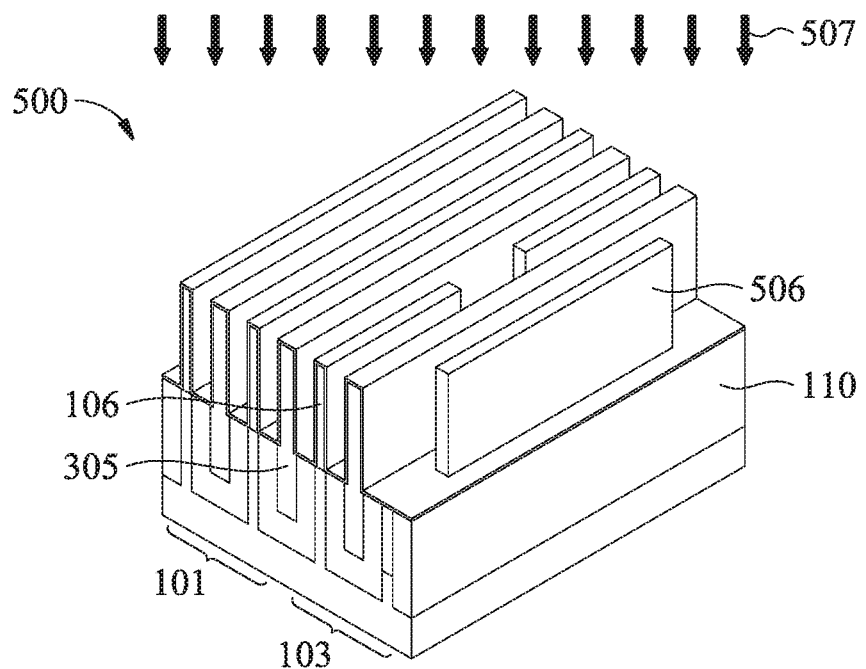
Figure 5H:
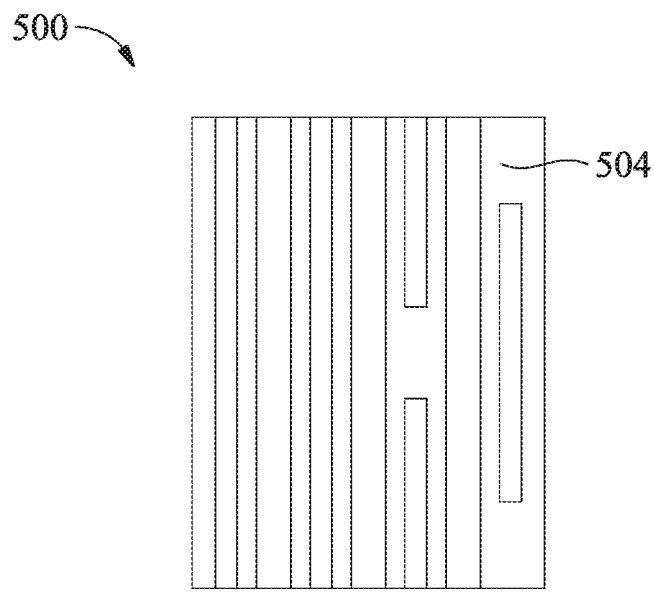

FIG. 5G illustrates the workpiece 500 after a deposition process 507 to form a gate dielectric 504 over the fin structures 101, 103 and the dummy fins 305. The gate dielectric 504 may be a high-k dielectric. The gate dielectric 504 may be deposited using an ALD process. Other conformal deposition processes are contemplated. FIG. 5H illustrates a top view of the gate dielectric layer 504.

Figure 5I:
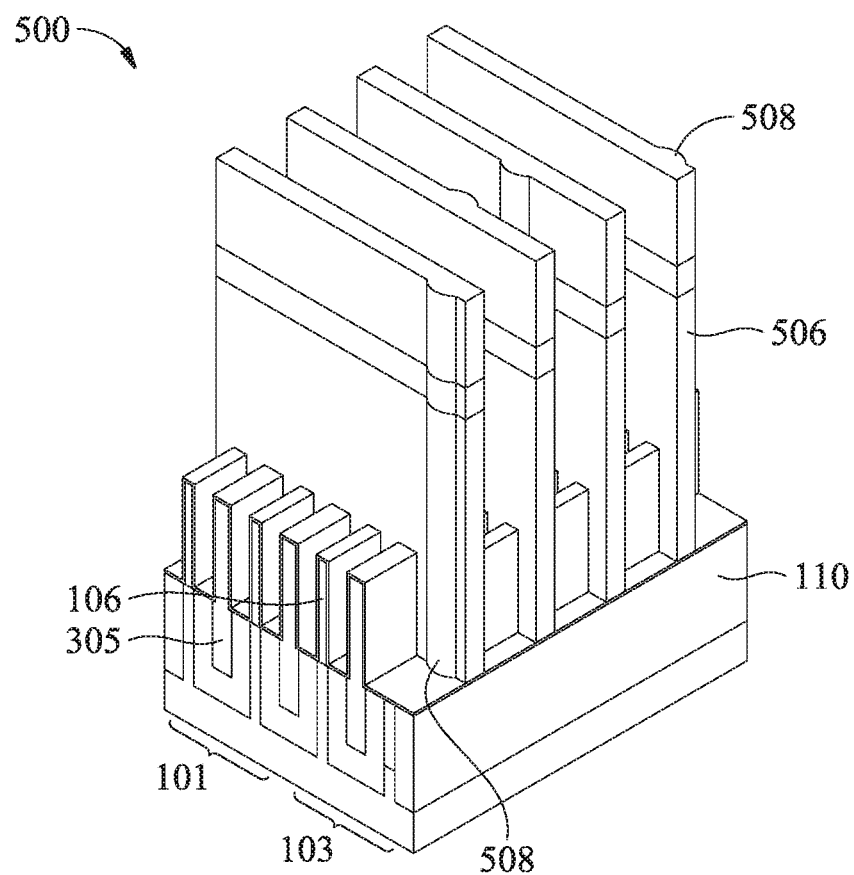
Figure 5J:
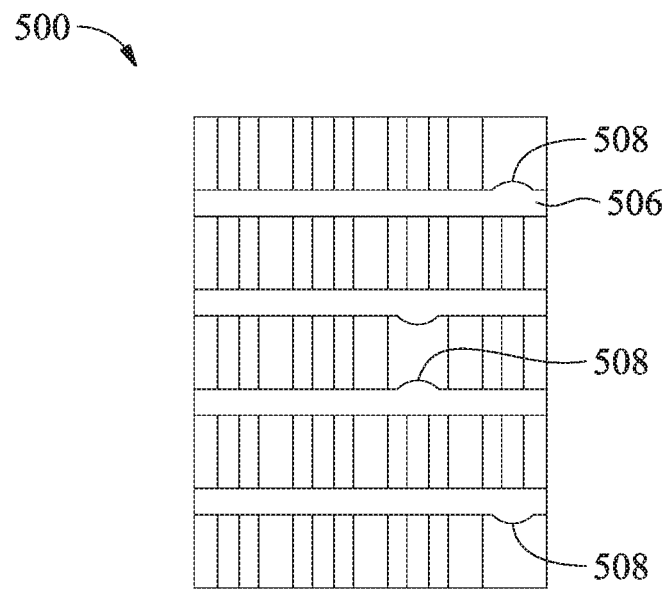

FIG. 5I illustrates the workpiece 100 after a process 319 to form gate devices 506. The gate devices 508 run perpendicular to the fin structures 101, 103. The gate devices 506 may be made of a conductive material such as metal or polysilicon. The gate devices 506 may be formed using photolithographic processes. For example, layers in a gate stack may be depositing onto the workpiece 500. A photoresist may then be applied onto the gate stack layers. The photoresist may then be exposed to a light source through a photomask to pattern the photoresist. An etching process may then be applied to remove the exposed portions of the gate stack layers. FIG. 5J illustrates a top view of the gate devices 506. After the gate devices 506 are formed, the source/drain regions may be formed similar to the processes described in the text above accompanying FIG. 1S.

In the present example, the gate devices include gate extensions 508 that extend into the area above the fin-cut regions. The extensions may be formed in the patterning process to form the gates 508. In other words, the photomask used in the gate patterning process may include gate features with gate extensions. The gate extension may have a range of about 1-6 nanometers. The gate extensions help reduce STI loss during subsequent processing steps.

Figure 5K:
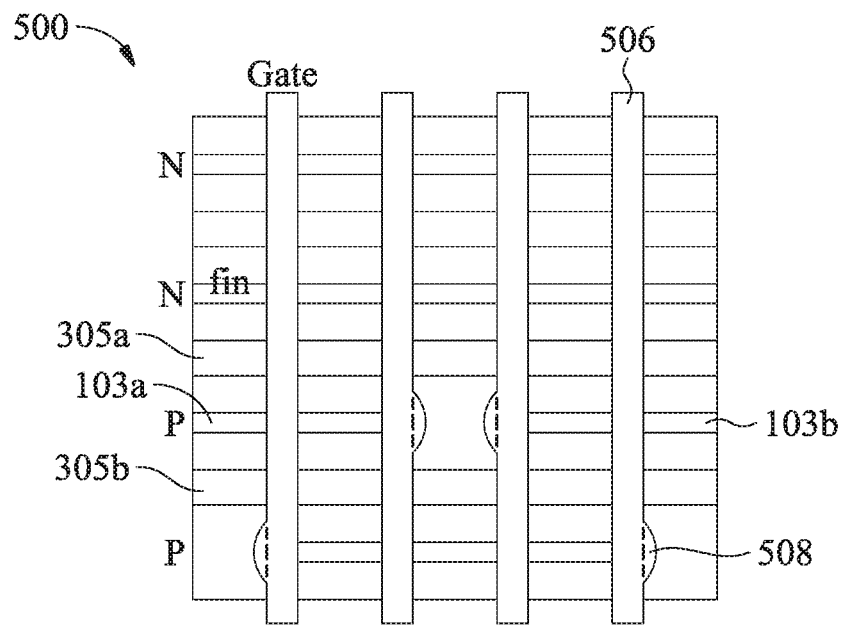

FIG. 5K is a top view of a device formed with gate extensions extending into the fin-cut region. As can be seen, the gate extensions 508 are formed at both sides of the fin cut regions.

Figure 6:
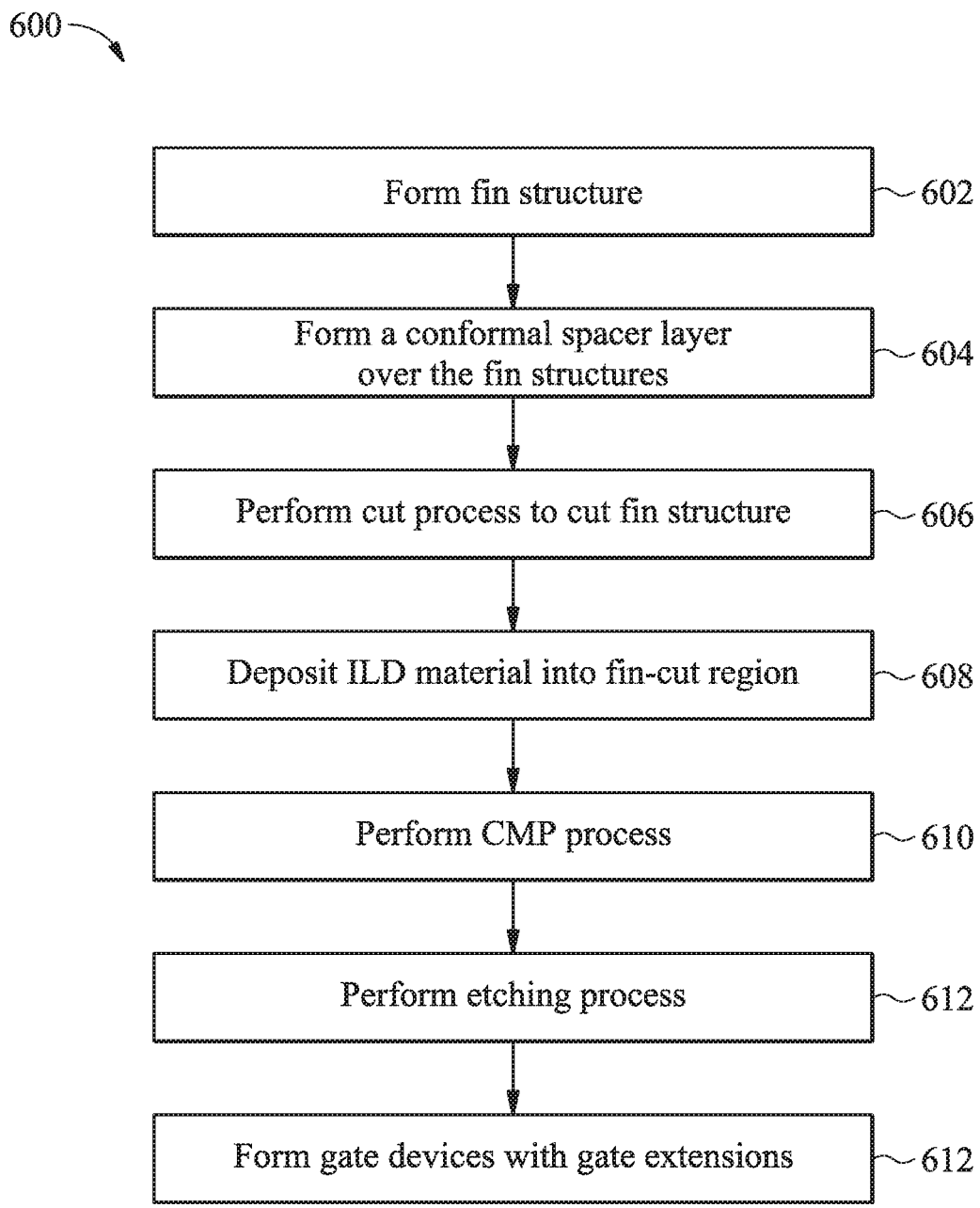
FIG. 6 is a flowchart showing an illustrative method for forming gate extensions within a fin-cut region, according to one example of principles described herein.

FIG. 6 is a flowchart showing an illustrative method 600 for forming gate extensions within a fin-cut region. According to the present example, the method 600 includes a process 602 for forming a fin structure. In one example, the fin structure may be for a PMOS device. The fin structure may correspond to one of the fin structures 103 shown in FIG. 1A. The fin structure may be formed on a substrate. The PMOS fin structure may include a lower portion and an upper portion. In one example, the lower portion is made of the same type of semiconductor material as the substrate 102. For example, if it is a silicon substrate, then the silicon lower portion of the PMOS fin structure may be silicon. The upper portion of the fin structure may include a different semiconductor material such as silicon germanium. The fin structure may be formed in a variety of manners. In one example, the fin structure may be formed by using photolithographic techniques to pattern the semiconductor substrate and perform an etching process that defines the fin structure.

The method 600 further includes a step 604 for forming a conformal spacer layer (e.g., 110, FIG. 1C) over the fin structures. The spacer layer may be formed using one of a variety of methods. In one example, the spacer layer is formed using an Atomic Layer Deposition (ALD) process. A conformal process, such as ALD is used so that gaps remain between the fin structures.

The method 600 further includes a step 606 for performing a cut process to cut the fin structure. The cut process may involve one or more etching steps to etch various materials. For example, the cut process involves removing the conformal spacer layer 110 and the fin structure 103 to a particular depth. The cut process results in fin-cut regions that separate one portion (e.g., 103a, FIG. 3K) from another portion (e.g., 103b, FIG. 3K).

The method 600 further includes a step 608 for depositing an ILD layer (e.g., 502, FIG. 5A) into the fin-cut regions. The ILD layer 502 fills the gaps between the fin structures 101, 103, and dummy fins 305. The material for the ILD layer may be selected so that it can be selectively etched with respect to the dummy fin structures. In other words, the dielectric materials are selected so that one can be etched without substantially affecting the other.

The method 600 further includes a step 610 for performing a CMP process (e.g., 503, FIG. 5C) to planarize the workpiece. The CMP process exposes the top surfaces of the dummy fins, the fin structures, and the ILD material formed within the fin-cut regions.

The method 600 further includes a step 612 for performing an etching process (e.g., 505, FIG. 5E). The etching process 505 exposes the upper portions of the fin structures and the dummy fins.

The method 600 further includes a step 614 for forming gates and source/drain regions. Before the gates and source/drain regions are formed, a deposition process is applied to form an isolation layer in the gap above the dummy fin structure. Then, a CMP process is used to planarize the workpiece. Next, an etching process is used to remove a portion of the spacer layer and the ILD material to expose the upper portions of the fin structures. The etching process also exposes the upper portions of the dummy fins that run parallel with and between the fin structures. The gates run perpendicular to the fin structure and may be formed using a plurality of deposition processes to form a gate stack, starting with a gate dielectric. The gate devices include gate extensions (e.g., 508, FIG. 5I) that extend into the area above the fin-cut regions. The extensions may be formed in the patterning process to form the gates 508. In other words, the photomask used in the gate patterning process may include gate features with gate extensions. The gate extension may have a range of about 1-6 nanometers. The gate extensions help reduce STI loss during subsequent processing steps.

After the gates have been formed. Sidewall spacers may be formed on the gates. Then, the source/drain regions may be formed within the fin structures adjacent the gates. The source/drain regions may be formed using an epitaxial process.

A semiconductor device includes a substrate, a first elongated fin structure disposed on the substrate, and a second elongated fin structure disposed on the substrate. The longitudinal axis of the first elongated fin structure is aligned with a longitudinal axis of the second elongated fin structure. The device further includes a dummy structure extending between the first elongated fin structure and the second elongated fin structure. The dummy structure includes a dielectric material.

A method for fabricating a semiconductor device includes forming an elongated fin structure, performing an etching process to cut the elongated fin structure into a first portion and a second portion, and forming a dummy structure within a gap between the first portion and the second portion.

A semiconductor device includes a substrate and a plurality of elongated fin structures disposed on the substrate. The plurality of elongated fin structures includes a first elongated fin structure. The longitudinal axis of the first elongated fin structure is aligned with a longitudinal axis of a second elongated fin structure. A plurality of dummy fins are positioned between the plurality of elongated fin structures. A dummy structure is positioned between the first elongated fin structure and the second elongated fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a first elongated fin structure disposed on the substrate;
   a second elongated fin structure disposed on the substrate, a longitudinal axis of the first elongated fin structure being aligned with a longitudinal axis of the second elongated fin structure; and
   a dummy structure extending between the first elongated fin structure and the second elongated fin structure, the dummy structure comprising a dielectric material.

2. The semiconductor device of claim 1, wherein the dummy structure comprising a dummy fin structure in direct contact with the first elongated fin structure and in direct contact with the second elongated fin structure, the first elongated fin structure and the second elongated fin structures being functional fin structures.

3. The semiconductor device of claim 2, wherein the dummy fin structure has a smaller height than the first elongated fin structure.

4. The semiconductor device of claim 3, wherein a difference in height between the dummy fin structure and the elongated fin structure is within a range of 1-30 nanometers.

5. The semiconductor device of claim 1, wherein the first elongated fin structure and second elongated fin structure comprise silicon germanium.

6. The semiconductor device of claim 1, wherein a length of the dummy structure from an end of the first elongated fin structure to an end of the second elongated fin structure is within a range of about 12-20 nanometers.

7. The semiconductor device of claim 1, wherein the dummy structure comprises at least one of: SiCN, SiN, SiOCN, $HfO_2$, $ZrO_2$, $HfAlO_x$, and $HfSiO_x$.

8. The semiconductor device of claim 1, wherein the elongated fin structure is part of a transistor for an n-type device.

9. The semiconductor device of claim 1, wherein the elongated fin structure is part of a transistor for a Static Random Access Memory (SRAM) device.

10. The semiconductor device of claim 9, wherein the transistor is a pull-up transistor.

11. A semiconductor device comprising:
    a substrate;
    a plurality of elongated fin structures disposed on the substrate, the plurality of elongated fin structures comprising a first elongated fin structure, wherein a longitudinal axis of the first elongated fin structure is aligned with a longitudinal axis of a second elongated fin structure;
    a plurality of dummy fins positioned between the plurality of elongated fin structures; and
    a dummy structure positioned between the first elongated fin structure and the second elongated fin structure.

12. The semiconductor device of claim 11, wherein the dummy structure comprises a dummy fin structure extending between the first elongated fin structure and the second elongated fin structure, the dummy structure having a different height than the plurality of elongated fin structures.

13. The semiconductor device of claim 12, wherein the dummy structure comprises at least one of: SiCN, SiN, SiOCN, $HfO_2$, $ZrO_2$, $HfAlO_x$, and $HfSiO_x$.

14. The semiconductor device of claim 11, wherein the elongated fin structure is part of a transistor for an n-type device.

15. The semiconductor device of claim 11, wherein the elongated fin structure is part of a transistor for a Static Random Access Memory (SRAM) device.

16. The semiconductor device of claim 15, wherein the transistor is a pull-up transistor.

17. A semiconductor device comprising:
    an elongated fin structure, wherein the elongated fin structure includes a first portion and a second portion, wherein a longitudinal axis of the first portion is aligned with the longitudinal axis of the second portion; and
    a dummy structure positioned and separating the first portion and the second portion.

18. The device of claim 17, wherein the dummy structure comprises a dummy fin structure extending between the first portion and the second portion.

19. The device of claim 18, wherein the dummy fin structure has a smaller height than the elongated fin structure.

* * * * *